United States Patent [19]

Karasawa et al.

[11] Patent Number: 5,773,172
[45] Date of Patent: Jun. 30, 1998

[54] COLOR FILTER HAVING NOVEL DYESTUFF

[75] Inventors: Akio Karasawa, Yokohama; Hisato Itoh, Omuta, both of Japan

[73] Assignee: Mitsui Toatsu Chemicals, Inc., Tokyo, Japan

[21] Appl. No.: 659,616

[22] Filed: Jun. 6, 1996

Related U.S. Application Data

[63] Continuation of Ser. No. 269,771, Jul. 1, 1994, abandoned.

[30] Foreign Application Priority Data

Jul. 9, 1993 [JP] Japan .................................. 5-170434
Mar. 18, 1994 [JP] Japan .................................. 6-048409

[51] Int. Cl.⁶ .................................................. G03F 9/00
[52] U.S. Cl. .......................... 430/7; 428/411.1; 359/885
[58] Field of Search ........................... 430/7, 321, 20; 428/411.1; 359/885

[56] References Cited

U.S. PATENT DOCUMENTS

4,036,862  7/1977  Hederich et al. .

FOREIGN PATENT DOCUMENTS

| | | |
|---|---|---|
| 0 546 856 A2 | 6/1993 | European Pat. Off. . |
| 0 564 237 A1 | 10/1993 | European Pat. Off. . |
| 59-204010 | 11/1984 | Japan . |
| 59-204011 | 11/1984 | Japan . |
| 60-249102 | 12/1985 | Japan . |
| 61-140902 | 6/1986 | Japan . |
| 61-246258 | 11/1986 | Japan . |
| 61-254903 | 11/1986 | Japan . |
| 61-254904 | 11/1986 | Japan . |
| 61-268761 | 11/1986 | Japan . |
| 62-74960 | 4/1987 | Japan . |
| 62-136604 | 6/1987 | Japan . |
| 62-136606 | 6/1987 | Japan . |
| 62-197459 | 9/1987 | Japan . |
| 64-6904 | 1/1989 | Japan . |
| 64-88505 | 4/1989 | Japan . |
| 1-233401 | 9/1989 | Japan . |
| 2-108068 | 4/1990 | Japan . |
| 1456723 | 11/1976 | United Kingdom . |

OTHER PUBLICATIONS

Ukponmwan, David et al. "Improved Fastness Properties for Disperse Dyes" Chem. Color. (1986) 18(5), pp. 24–25.

Ukponmwan, David. et al."Physical Characteristics of Synthesized 1-amino-4-(arylamino)-2-ether dyes for Synthetic Polymer Fibers".

J. Chem. Eng. Data (1984), 29(4), pp. 482–483.

Ukponmwan, David et al., Physical Characteristics of Synthesized 1,4-bis(arylamino)-2-(aryloxy)anthraquinone Dyes for Synthetic Polymer Fibers, J. Chem. Eng. Data (1987), 32(2), pp. 282–284.

Greenhalgh, et al., "1-N-Methylamino-4-(arylamino)anthraquinone-2-aryl Ethers: Dyes for Synthetic-Polymer Fibres". *Dyes and Pigments*, vol. 8(1987), pp. 231–237.

'90's Development & Market Trend of Special Functional Dyestuffs, 47–48, CMC Co., Ltd. (no abstract).

*Primary Examiner*—George F. Lesmes
*Assistant Examiner*—Laura Weiner
*Attorney, Agent, or Firm*—Burns, Doane, Swecker & Mathis, L.L.P.

[57] ABSTRACT

Dyestuffs represented by the below-described formula (1), that is, dyestuffs formed of a chromophoric nucleus and a bisphenol introduced therein have excellent solubility in solvents and binder resins, and can provide color filters having excellent transmittance characteristics and durability.

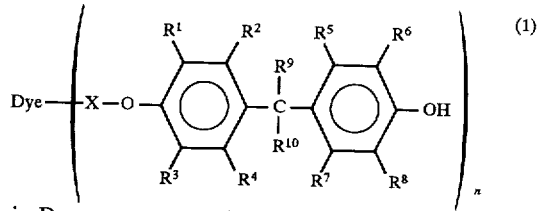

wherein Dye represents a chromophoric nucleus, X represents a direct bond or a divalent connecting group, $R^1$ to $R^{10}$ and n are defined with the provision that one of $R^9$ and $R^{10}$ has 3 or more carbon atoms.

2 Claims, 11 Drawing Sheets

FIG. 1(B)  Step 1: Coating and Drying

FIG. 1(C)  Step 2: Exposing

FIG. 1(D)  Step 3: Depositing and Post-baking

F I G. 2
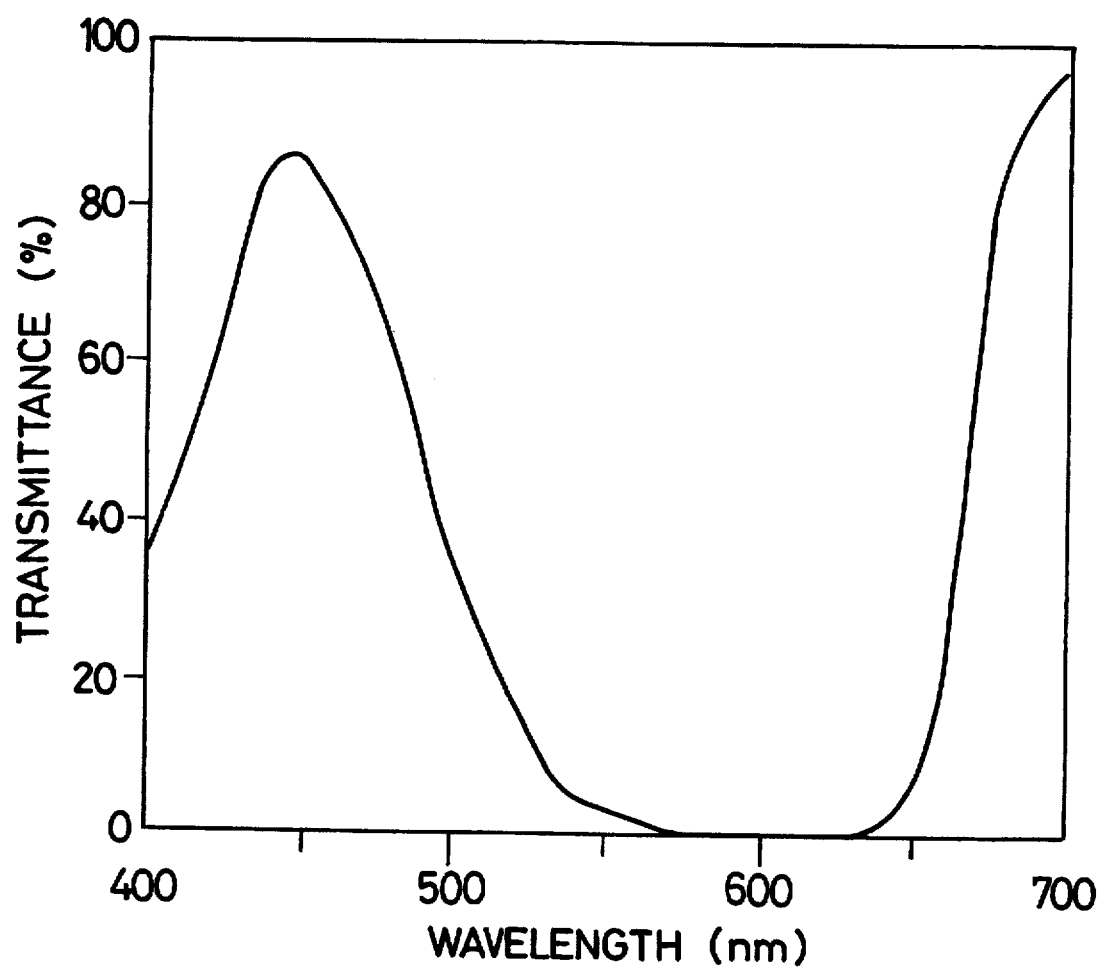

F I G. 3
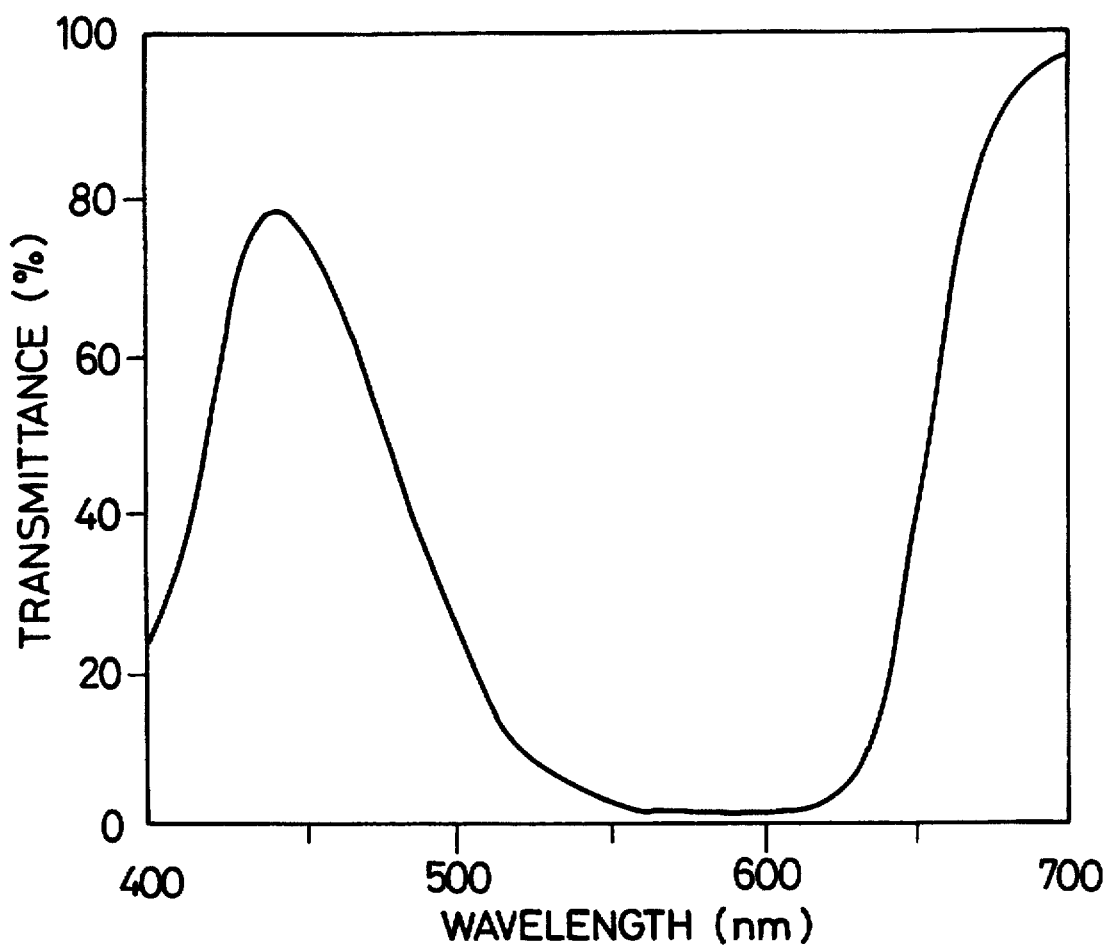

F I G. 4
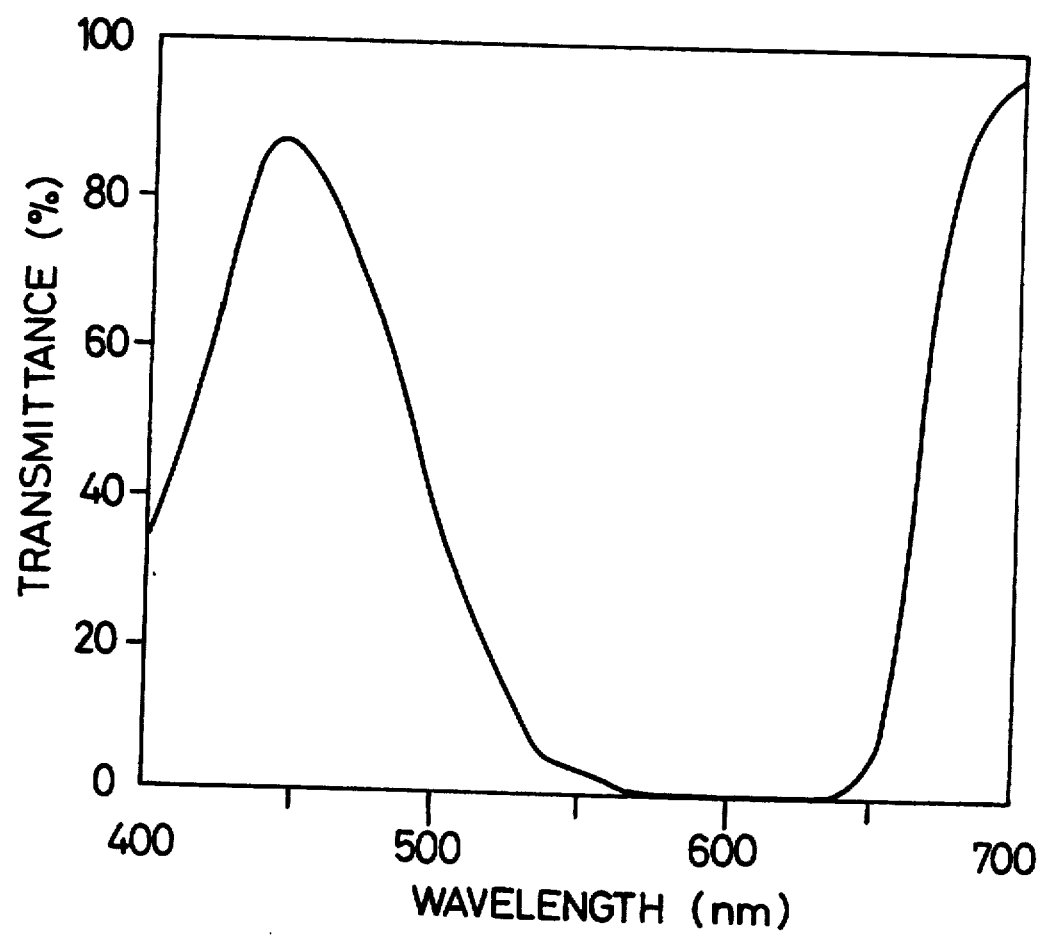

F I G. 5
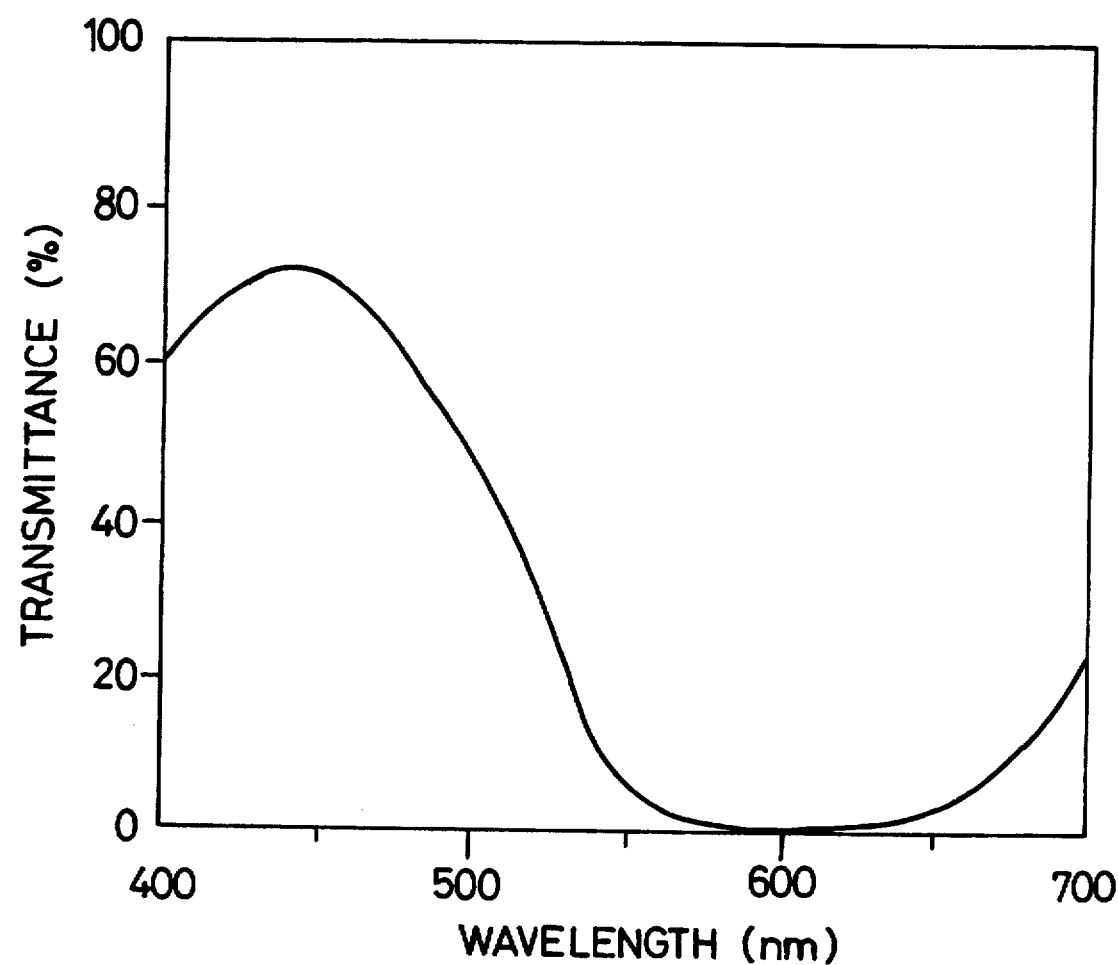

F I G. 8
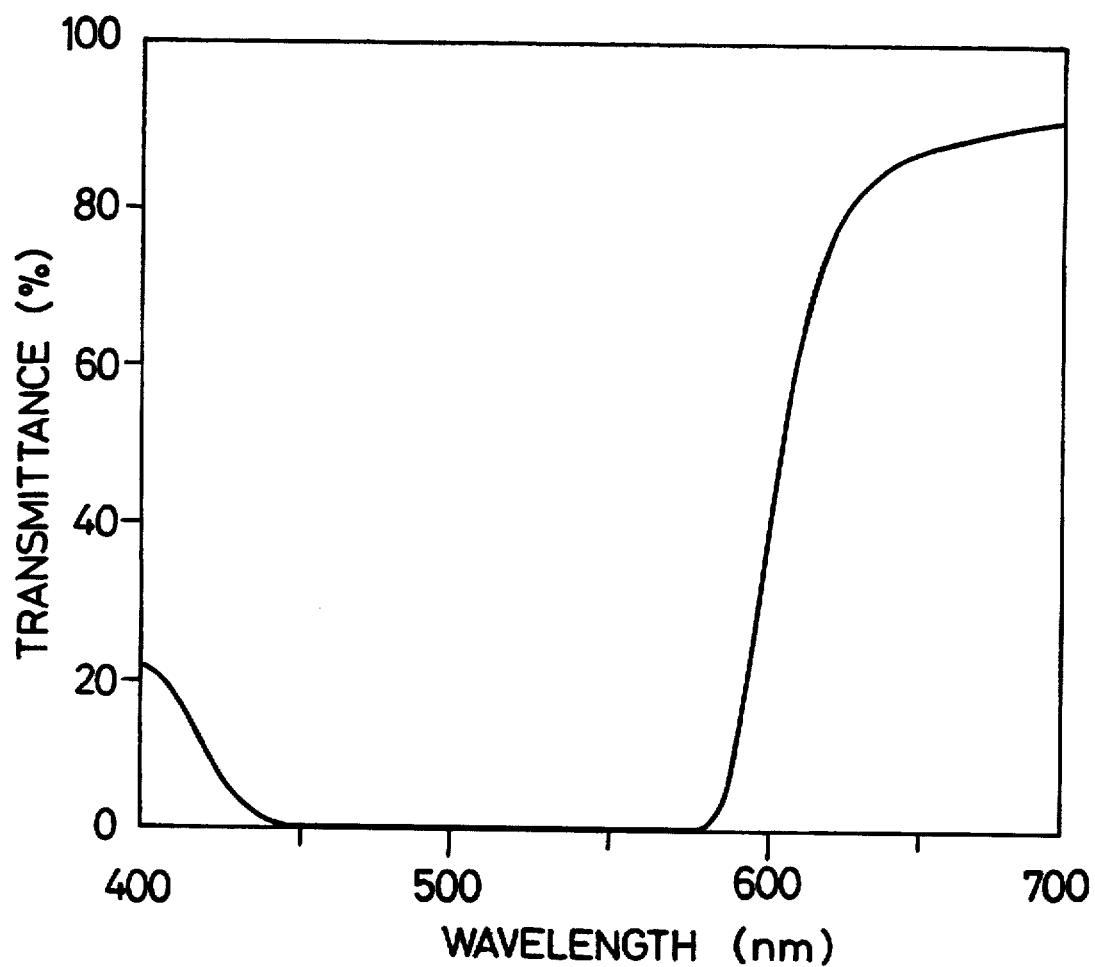

F I G. 10
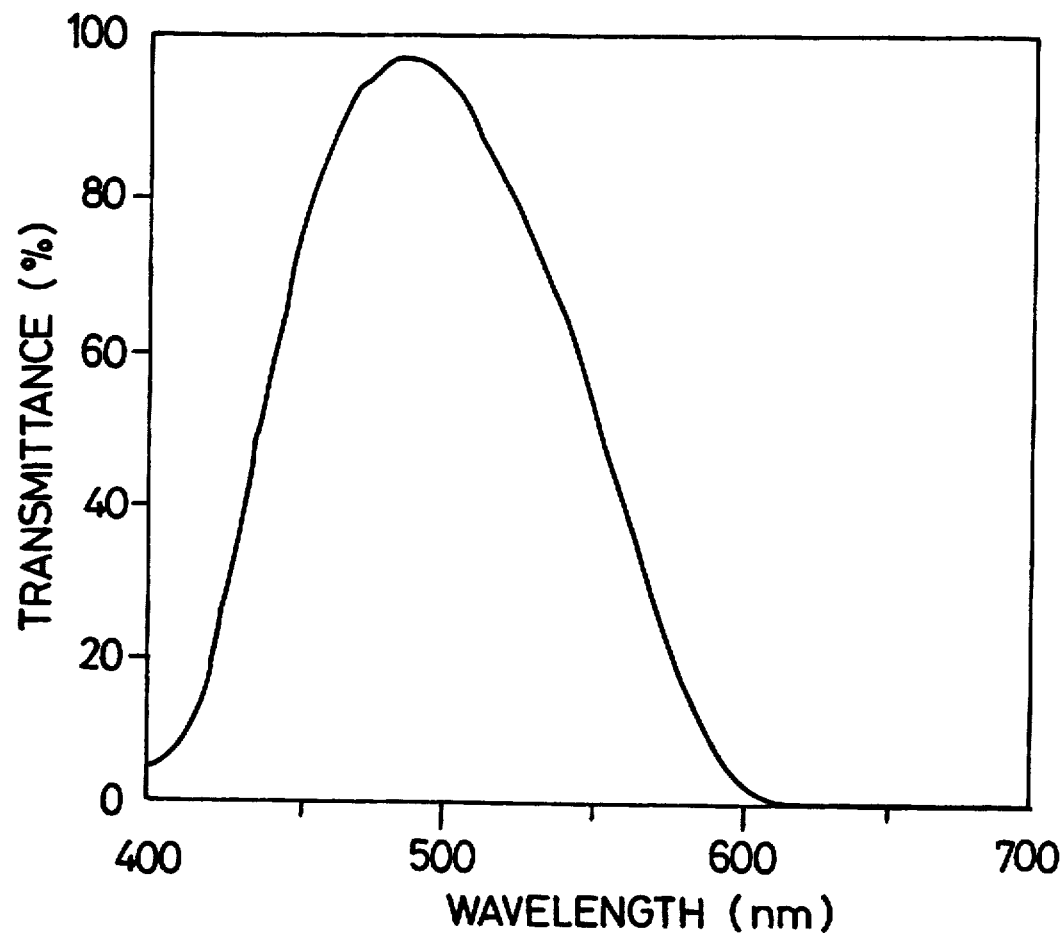

COLOR FILTER HAVING NOVEL DYESTUFF

This application is a continuation of application Ser. No. 08/269,771, filed Jul. 1, 1994, now abandoned.

BACKGROUND OF THE INVENTION a) Field of the Invention

This invention relates to dyestuffs, which play an important role in color filters for display devices such as liquid crystal television sets and also in color separation filters for image pickup tubes, color copiers, video printers and the like.

b) Description of the Related Art

Conventionally known dyestuffs for filters include, as blue dyestuffs, anthraquinone dyestuffs (Japanese Patent Laid-Open Nos. 136604/1987 and 197459/1987) and triphenylmethane dyestuffs ("1990s Development and Market Trend of Special Functional Dyestuffs", 47–48, CMC Co., Ltd.); as red dyestuffs, anthraquinone dyestuffs (Japanese Patent Laid-Open No. 74960/1987), azo dyestuffs ("1990s Development and Market Trend of Special Functional Dyestuffs", 47, CMC Co., Ltd.) and perinone dyestuffs (Japanese Patent Laid-Open No. 136606/1987); as green dyestuffs, anthraquinone dyestuffs (Japanese Patent Laid-Open No. 246258/1986), triphenylmethane dyestuffs ("1990s Development and Market Trend of Special Functional Dyestuffs", 47–48, CMC Co., Ltd.), phthalocyanine dyestuffs (Japanese Patent Laid-Open Nos. 249102/1985, 140902/1986, 254903/1986, 254904/1986, 6904/1989, 88505/1989, and 233401/1989), perinone dyestuffs (Japanese Patent Laid-Open No. 136606/1987), and naphthoquinone dyestuffs (Japanese Patent Laid-Open No. 268761/1986); and as yellow dyestuffs, azo and vat-dye pigments ("1990s Development and Market Trend of Special Functional Dyestuffs", 48, CMC Co., Ltd.) and water-soluble azo dyes (Japanese Patent Laid-Open Nos. 204010/1984 and 204011/1984).

As to the blue dyestuffs, the anthraquinone compounds do not permit sufficient light transmission around 440 nm but have high transmittance at wavelengths of 500 nm and longer, so that they have a broad transmittance curve. In the case of the triphenylmethane dyestuffs, their molecules are in an ionized form so that they are suited for coloring filters making use of gelatin or casein as a substrate and were hence used in gelatin-type filters. Those filters themselves however had low light fastness and heat resistance. Turning next to the red dyestuffs, the anthraquinone compounds and perinone compounds are accompanied by the drawback that they have low transmittance and poor color visibility, although their durability is good. The azo compounds are water-soluble and are thus suited for coloring filters making use of gelatin or casein as a substrate. The azo compounds were therefore employed in gelatin-type filters. Due to poor heat and moisture resistance of the filters themselves, their applications were limited. Further, for poor light fastness, heat resistance and moisture resistance of the dyestuffs themselves, the filters were not usable in general devices. Among the green dyestuffs, sulfo-containing phthalocyanine compounds which are water-soluble compounds are suited in coloring filters making use of gelatin or casein as a substrate and were hence used in gelatin-type filters. Their applications were however limited due to poor heat and moisture resistance of the filters themselves. Further, the anthraquinone and naphthoquinone dyestuffs do not permit sufficient transmission for light of 500–600 nm and their light fastness is not sufficient. In the case of the triphenylmethane dyestuffs, their molecules are in an ionized form so that they are suited for coloring filters making use of gelatin or casein as a substrate and were hence used in gelatin-type filters. Those filters themselves however had poor heat and moisture resistance so that a limitation was imposed on their applications. In addition, due to poor light fastness, heat resistance and moisture resistance of the dyestuffs themselves, they were not usable in general display devices. Dealing finally with the yellow dyestuffs, the azo pigments and vat dyes are used for the fabrication of filters by the pigment dispersion method. Although filters obtained by the pigment dispersion method have high pattern accuracy and excellent heat resistance and light fastness, they are accompanied by the following drawbacks:

(1) Due to scattering of light by pigment particles, the filters have inferior light transmittance and poor contrast.

(2) Prior to coating a photosensitive resin in which a pigment is uniformly dispersed, it is necessary to eliminate dirt and large particles by causing the photosensitive resin to pass through a screen, leading to potential problems, for example, troubles in the fabrication process such as screen clogging due to agglomeration of pigment particles.

The water-soluble azo dyes are used for the fabrication of filters by the dyeing method. Color filters obtained by the dyeing method are excellent in pattern resolution, dimensional accuracy and light transmission and also high in color lightness. They are however accompanied with the drawback that their heat resistance is insufficient for their use of gelatin or casein as a photosensitive resin.

SUMMARY OF THE INVENTION

An object of the present invention is to improve the above-described drawbacks of the conventional filters and dyestuffs and hence to obtain a filter excellent in transmittance characteristics, light fastness and heat resistance.

To attain the above-described object, the present inventors have proceeded with an extensive investigation. As a result, it has been found that introduction of a specific substituent group, namely, a group represented by the below-described formula (7) into a chromophoric nucleus can provide a dyestuff having a solubility of 3% or higher in a solvent such as Ethyl Cellosolve acetate or Butyl Cellosolve acetate and a solubility of 10% or higher in a binder polymer and thus a filter excellent in transmittance characteristics and durability and free of light scattering, leading to the completion of the present invention. As a reason for the excellent solubility of the dyestuff having the specific substituent group represented by formula (7) in the solvent and binder polymer, it has been found that the existence of the phenolic hydroxyl group and one or more alkyl groups in $R^9$ and $R^{10}$ is contributory and when one of $R^9$ and $R^{10}$ has 3 or more carbon atoms, good solubility is shown.

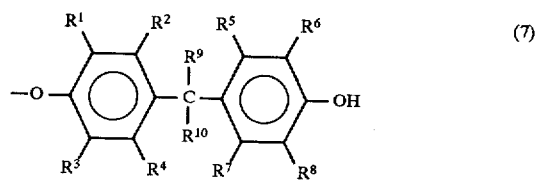

(7)

wherein $R^1$ to $R^{10}$ have the same meanings as in formula (1). Incidentally, the term "dissolved" as used herein means that a dyestuff is present in the form of single molecules of 0.01 μm or smaller in diameter.

The present invention therefore relates to a novel dyestuff represented by the following formula (1) and also to its use.

Formula (1) being:

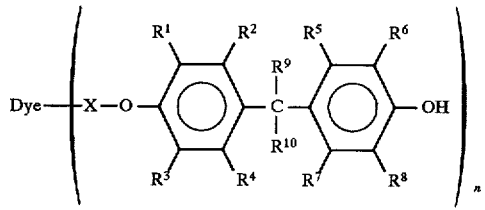

wherein Dye represents a chromophoric nucleus, X represents a direct bond or a divalent connecting group, $R^1$ to $R^8$ independently represent a hydrogen atom, a halogen atom, a substituted or unsubstituted alkyl group, a substituted or unsubstituted cycloalkyl group or a substituted or unsubstituted alkoxyl group, $R^9$ and $R^{10}$ independently represent a hydrogen atom or a substituted or unsubstituted alkyl group, and n stands for an integer of 1 to 10, with the proviso that the total carbon number of $R^9$ and $R^{10}$ is at least 3.

The dyestuff according to the present invention, which has been obtained by introducing the substituent represented by formula (7) into a chromophoric nucleus, has excellent solubility in solvents and binder resins and has made it possible to provide color filters excellent in transmittance characteristics and durability.

BRIEF DESCRIPTION OF THE DRAWINGS

FIG. 2 diagrammatically shows transmittance characteristics of a filter obtained in Example 1;

FIG. 3 diagrammatically depicts transmittance characteristics of a filter obtained in Example 2;

FIG. 4 diagrammatically illustrates transmittance characteristics of a filter obtained in Example 3;

FIG. 5 diagrammatically presents transmittance characteristics of a filter obtained in Comparative Example 1;

FIG. 8 diagrammatically illustrates transmittance characteristics of a filter obtained in Example 6;

FIG. 10 diagrammatically shows transmittance characteristics of a filter obtained in Example 7.

DETAILED DESCRIPTION OF THE PREFERRED EMBODIMENTS

Figure 1A:
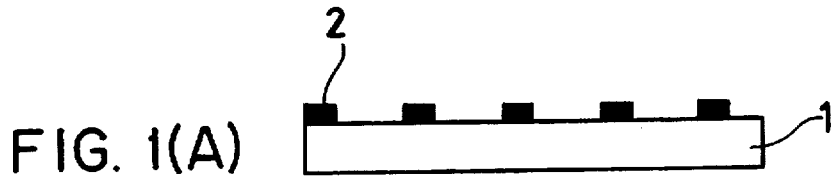
FIG. 1 illustrates steps for the formation of a stripe filter.
Figure 1E:
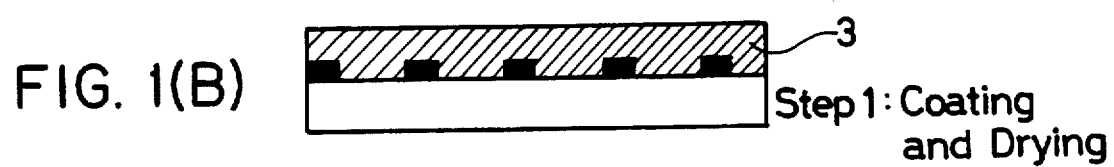
Figure 1E:
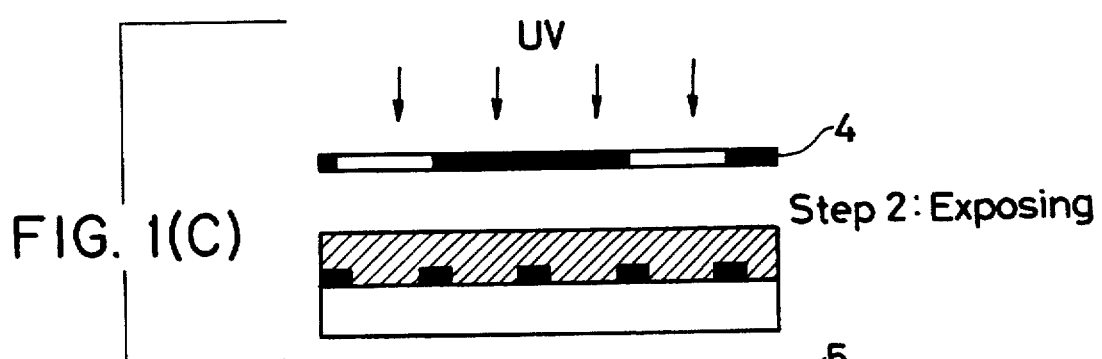
Figure 1E:
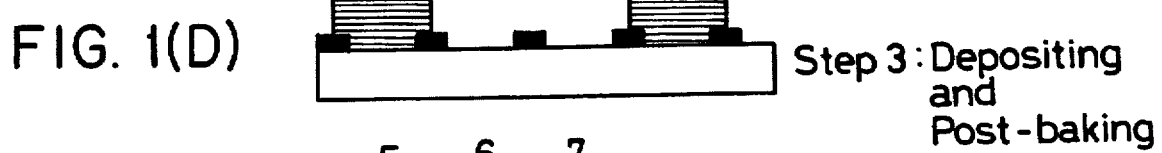
Figure 1E:

The novel dyestuff according to the present invention is represented by formula (1), namely, is a novel compound containing a group or groups represented by formula (7) described above. A description will hereinafter be made of the substituents represented $R^1$ to $R^{10}$ in formula (1).

Examples of the unsubstituted alkyl group can include linear or branched alkyl groups having 1 to 20 carbon atoms, preferably linear or branched alkyl groups having 1 to 12 carbon atoms, and more preferably, linear or branched alkyl groups such as methyl, ethyl, n-propyl, iso-propyl, n-butyl, iso-butyl, sec-butyl, t-butyl, n-pentyl, iso-pentyl, neo-pentyl, 1,2-dimethylpropyl, n-hexyl, n-dodecyl, 2-methylbutyl, 2-methylpentyl, 1,3-dimethylbutyl, 1-iso-propylpropyl, 1,2-dimethylbutyl, n-heptyl, 1,4-dimethylpentyl, 2-methyl-1-iso-propylpropyl, 1-ethyl-3-methylbutyl, n-octyl, 2-ethylhexyl, 3-methyl-1-iso-propylbutyl, 2,2-dimethyl-1-iso-propyl-1-t-butylpropyl and n-nonyl.

Illustrative of the substituted alkyl group are linear or branched alkyl groups substituted by one or more of alkoxy, halogen, hydroxyl and/or amino substituents and having 1 to 30 carbon atoms, preferably linear or branched alkyl groups substituted by one or more of alkoxy, halogen, hydroxyl and amino substituents and having 1 to 8 carbon atoms, and more preferably alkoxyalkyl groups such as methoxymethyl, methoxyethyl, ethoxyethyl, propoxyethyl, butoxyethyl, γ-methoxypropyl, γ-ethoxypropyl, methoxyethoxyethyl, ethoxyethoxyethyl, dimethoxymethyl, diethoxymethyl, dimethoxyethyl and diethoxyethyl, halogenated alkyl groups such as chloromethyl, 2,2,2-trichloroethyl, trifluoromethyl and 1,1,1,3,3,3-hexafluoro-2-propyl, hydroxyalkyl groups such as hydroxymethyl, hydroxyethyl, hydroxypropyl, hydroxybutyl, hydroxypentyl and hydroxyoctyl, and aminoalkyl groups such as 2-N,N-dimethylaminoethyl, 2-N,N-diethylaminoethyl and 3-N,N-diethylaminopropyl.

Examples of the unsubstituted alkoxy groups can include linear or branched alkoxy groups having 1 to 10 carbon atoms, preferably linear alkoxyl groups having 1 to 5 carbon atoms, more preferably methoxy, ethoxy, propoxy, butoxy and pentyloxy groups. Examples of the substituted alkoxy group can include linear or branched alkoxy groups substituted by one or more alkoxy and/or halogen substituents and having 1 to 20 carbon atoms, preferably linear alkoxy groups substituted by one or more alkoxy and/or halogen substituents and having 1 to 8 carbon atoms, more preferably alkoxyalkoxy groups such as methoxymethoxy, methoxyethoxy, ethoxyethoxy, ethoxymethoxy, methoxybutoxy, ethoxybutoxy and butoxybutoxy, and methoxy, ethoxy, propoxy, butoxy and pentyloxy groups substituted by one or more halogen atoms such as chlorine, bromine, iodine and/or fluorine.

Illustrative of the unsubstituted cycloalkyl group can include cycloalkyl groups having 5 to 12 carbon atoms. Preferred examples can include cyclopentyl, cyclohexyl and cycloheptyl groups. Examples of the substituted cycloalkyl group can include cycloalkyl groups substituted by one or more alkyl, halogen and/or alkoxy substituents and having 1 to 20 carbon atoms. Preferred examples can include cyclopentyl, cyclohexyl and cycloheptyl groups substituted by one or more of alkyl groups such as methyl, ethyl, propyl and butyl, halogen atoms such as chlorine, bromine, iodine and fluorine and alkoxy groups such as methoxy, ethoxy, propoxy and butoxy. Illustrative of the unsubstituted aryl group can include aryl groups having 6 to 20 carbon atoms, preferably phenyl and naphthyl groups. Illustrative of the substituted aryl group can include aryl groups substituted by one or more alkyl, halogen and/or alkoxy substituents and having 6 to 30 carbon atoms, preferably phenyl and naphthyl groups substituted by one or more of linear or branched alkyl groups such as methyl, ethyl, propyl, i-propyl, butyl and t-butyl, halogen atoms such as chlorine, bromine, fluorine and iodine and alkoxy groups such as methoxy, ethoxy, propoxy and butoxy. Illustrative halogen atoms include chlorine, bromine, iodine and fluorine atoms.

The chromophoric nucleus represented by Dye can be any one of known nuclei described in literature, such as azo, anthraquinone, phthalocyanine, quinophthalone, cyanine, dicyanostyryl, tricyanovinyl, indoaniline, fused polycyclic and indigo chromophoric nuclei [illustrative literature include "SHIKISO HANDBOOK (Dyestuff Handbook)", compiled by Okawara et al., Kodansha, Ltd. (1986) and "THE CHEMISTRY OF SYNTHETIC DYES", Vol. 1 to Vol. 6, Edited by K. Venkataraman, Academic Press Inc.]
Their skeletons are specifically listed below.
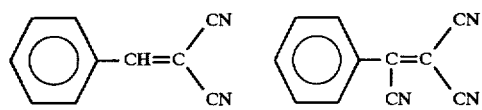
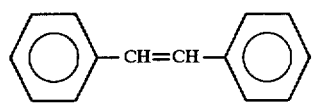
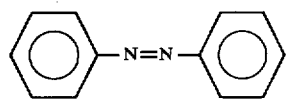
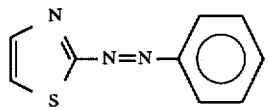
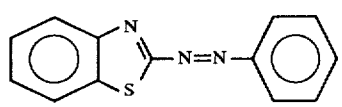
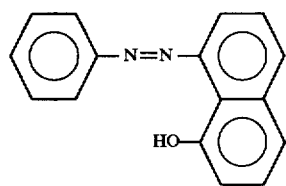
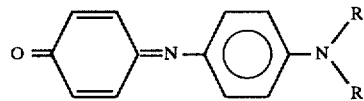
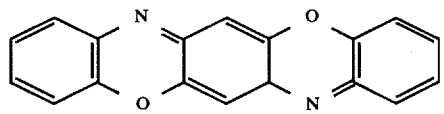
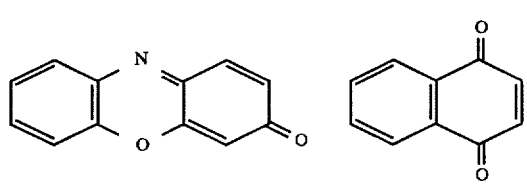
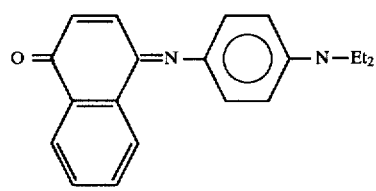
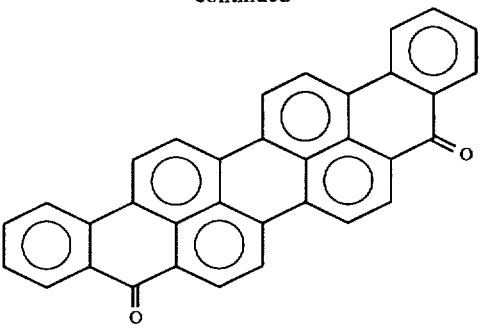
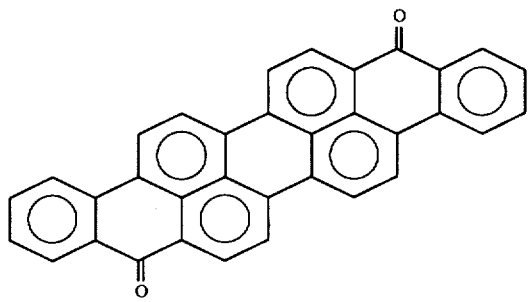
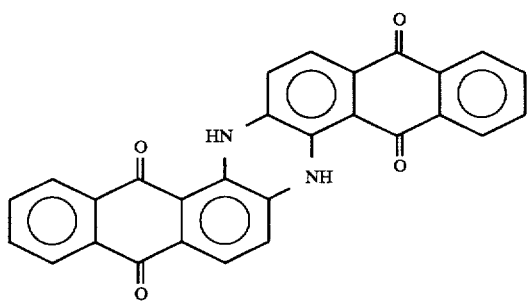
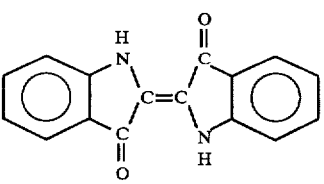
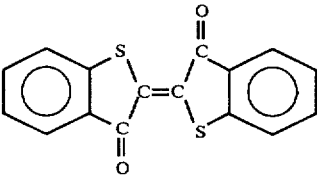
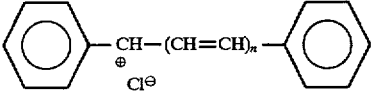
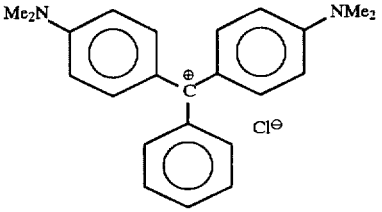

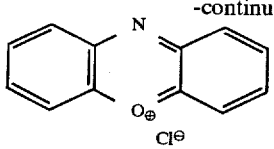

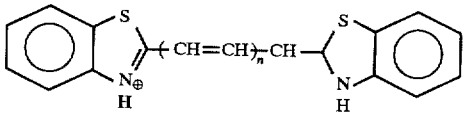

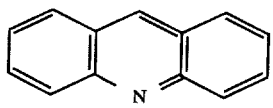

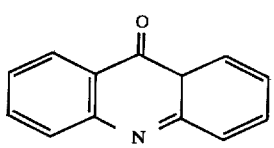

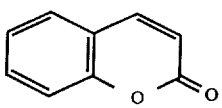

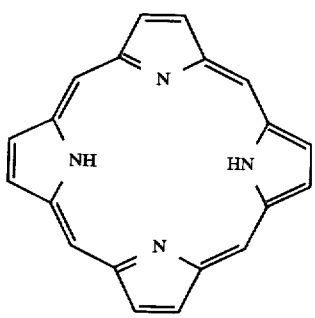

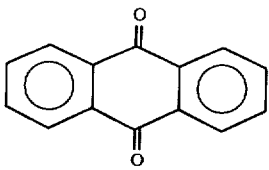

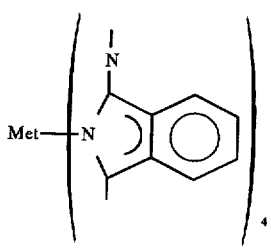

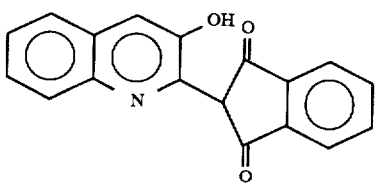

Preferred chromophoric nuclei can include:
anthraquinone derivatives—for example, 1,4-bis(anilino) anthraquinone, 1,4-bis(4-ethyl-2,6-dimethylanilino) anthraquinone, 1,4-bis(6-bromo-2,4-dimethylanilino) anthraquinone, 1,4-bis(anilino)-5,8-dihydroxyanthraquinone, 1,5-diamino-4,8-dihydroxyanthraquinone, 1-toluylamino-4-hydroxyanthraquinone, 1,4-diamino-2-phenylthioanthraquinone, 1-amino-2-phenoxy-4-hydroxyanthraquinone, and 1-amino-4-anilino2-phenylthioanthraquinone;

quinophthalone derivatives—for example, C.I. Disperse Yellow 54, and C.I. Disperse Yellow 64;

azo derivatives—for example, diphenylazo compounds, thiazole-phenylazo compounds, isothiazolephenylazo compounds, thiophene-phenylazo compounds, pyridine-phenylazo compounds, imidazole-phenylazo compounds, pyridone-phenylazo compounds, pyrazolonephenylazo compounds, benzothiazole-phenylazo compounds, and benzoisothiazole-phenylazo compounds; and phthalocyanine compounds—for example, α-alkoxyphthalocyanines.

The above chromophoric nuclei can contain one to eight of the following substituent groups:

linear or branched alkyl groups such as methyl, ethyl, n-propyl, iso-propyl, n-butyl, iso-butyl, sec-butyl, t-butyl, n-pentyl, iso-pentyl, neo-pentyl, 1,2-dimethylpropyl, n-hexyl, n-dodecyl, 2-methylbutyl, 2-methylpentyl, 1,3-dimethylbutyl, 1-iso-propylpropyl, 1,2-dimethylbutyl, n-heptyl, 1,4-dimethylpentyl, 2-methyl-1-iso-propylpropyl, 1-ethyl-3-methylbutyl, n-octyl, 2-ethylhexyl, 2-methyl-1-iso-propylbutyl, 2,2-dimethyl-1-iso-propyl-1-t-butylpropyl, and n-nonyl;

alkoxyalkyl groups such as methoxymethyl, methoxyethyl, ethoxyethyl, propoxyethyl, butoxyethyl, γ-methoxypropyl, γ-ethoxypropyl, methoxyethoxyethyl, ethoxyethoxyethyl, dimethoxymethyl, diethoxymethyl, dimethoxyethyl, and diethoxyethyl;

halogenated alkyl groups such as chloromethyl, 2,2,2-trichloroethyl, trifluoromethyl, 1,1,1,3,3,3-hexafluoro-2-propyl;

hydroxyalkyl groups such as hydroxymethyl, hydroxyethyl, hydroxypropyl, hydroxybutyl, hydroxypentyl, and hydroxyoctyl;

aryl groups such as phenyl, naphthyl and indenyl;

substituted aryl groups such as phenyl, naphthyl and indenyl groups having one or more of linear or branched alkyl groups such as methyl, ethyl, propyl, iso-propyl, butyl, 2-methylpropyl, pentyl and neo-pentyl, alkoxy groups such as methoxy, ethoxy and propoxy, and halogen atoms such as chlorine, fluorine, bromine and iodine;

aryloxy groups such as phenoxy and naphthyloxy;

substituted aryloxy groups such as phenoxyl and naphthyloxy groups having one or more of linear or branched alkyl groups such as methyl, ethyl, propyl, iso-propyl, butyl, 2-methylpropyl, pentyl and neo-pentyl, alkoxy groups such as methoxy, ethoxy and propoxy, and halogen atoms such as chlorine, fluorine, bromine and iodine;

arylthio groups such as phenylthio and naphthylthio;

substituted arylthio groups such as phenylthio and naphthylthio groups having one or more of linear or branched alkyl groups such as methyl, ethyl, propyl, iso-propyl, butyl, 2-methylpropyl, pentyl and neo-pentyl, alkoxy groups such as methoxy, ethoxy and propoxy, and halogen atoms such as chlorine, fluorine, bromine and iodine;

arylamino groups such as phenylamino and naphthylamino;

substituted arylamino groups such as phenylamino and naphthylamino groups having one or more of linear or branched alkyl groups such as methyl, ethyl, propyl, iso-propyl, butyl, 2-methylpropyl, pentyl and neo-pentyl, alkoxy groups such as methoxy, ethoxy and propoxy, and halogen atoms such as chlorine, fluorine, bromine and iodine;

linear or branched alkylamino groups such as methylamino, ethylamino, n-propylamino, iso-propylamino, n-butylamino, iso-butylamino, sec-butylamino, t-butylamino, n-pentylamino, isopentylamino, neo-pentylamino, 1,2-dimethylpropylamino, n-hexylamino, n-dodecylamino, 2-methylbutylamino, 2-methylpentylamino, 1,3-dimethylbutylamino, 1-iso-propylpropylamino, 1,2-dimethylbutylamino, n-heptylamino, 1,4-dimethylpentylamino, 2-methyl-1-iso-propylpropylamino, 1-ethyl-3-methylbutylamino, n-octylamino, 2-ethylhexylamino, 2methyl-1-iso-propylbutylamino, 2,2-dimethyl-1-iso-propyl-1-t-butylpropylamino, and n-nonylamino;

linear or branched dialkylamino groups such as dimethylamino, diethylamino, di(n-propyl)amino, di(iso-propyl)amino, di(n-butyl)amino, di(iso-butyl)amino, di(sec-butyl)amino, di(t-butyl)amino, di(n-pentyl)amino, di(iso-pentyl)amino, di(neo-pentyl)amino, di(1,2-dimethylpropyl)amino, di(n-hexyl)amino, di(n-dodecyl)amino, di(2-methylbutyl)amino, di(2-methylpentyl)amino, di(1,3-dimethylbutyl)amino, di(1-iso-propylpropyl)amino, di(1,2-dimethylbutyl)amino, di(n-heptyl)amino, di(1,4-dimethylpentyl)amino, di(2-methyl-1-iso-propylpropyl)amino, di(1-ethyl-3-methylbutyl)amino, di(n-octyl)amino, di(2-ethylhexyl)amino, di(2-methyl-1-iso-propylbutyl)amino, di(2,2-dimethyl-1-iso-propyl-1-t-butylpropyl)amino, and di(n-nonyl)amino; and amino group; hydroxyl group, nitro group; cyano group; and halogen atoms such as chlorine, bromine, iodine and fluorine.

Particularly preferred, illustrative chromophoric nuclei can include, from the standpoint of durability, dyestuff skeletons represented by the following formulas (2), (5) and (6):

Formula (2) being:

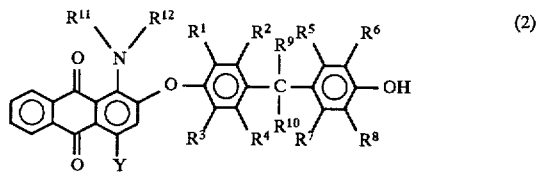

wherein $R^1$ to $R^{10}$ have the same meanings as defined in formula (1); $R^{11}$ and $R^{12}$ independently represent a hydrogen atom, an unsubstituted, linear or branched alkyl group having 1 to 20 carbon atoms, or a linear or branched alkyl group substituted by one or more halogen, alkoxy, hydroxyl and/or amino groups and having 1 to 30 carbon atoms in total; and Y represents a hydroxyl group, an amino group, a substituted or unsubstituted monoalkylamino group, or a substituted or unsubstituted arylamino group.

Formula (5) being:

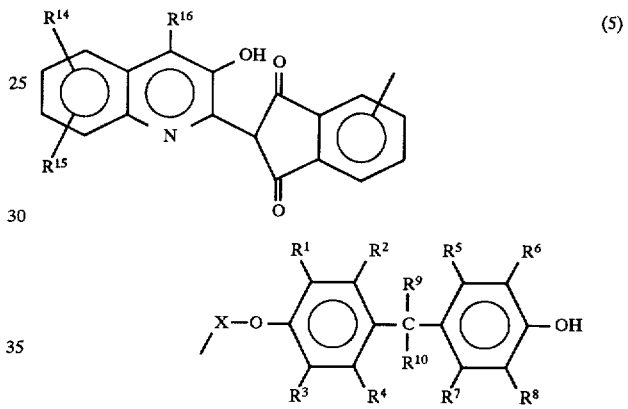

wherein $R^1$ to $R^{10}$ have the same meanings as defined in formula (1); $R^{14}$ and $R^{15}$ independently represent a hydrogen atom, an unsubstituted, linear or branched alkyl group having 1 to 20 carbon atoms, a linear or branched alkyl group substituted by one or more halogen, alkoxy, hydroxyl and/or amino groups and having 1 to 30 carbon atoms in total, an unsubstituted, linear or branched alkoxy group having 1 to 20 carbon atoms, a linear or branched alkoxy group substituted by one or more halogen, alkoxy, hydroxyl and/or amino groups and having 1 to 20 carbon atoms in total, or a halogen atom; $R^{16}$ represents a hydrogen atom or a halogen atom; and X represents —CO—, —COOCH$_2$CO— or —COOCH$_2$CH$_2$CO—.

Formula (6) being:

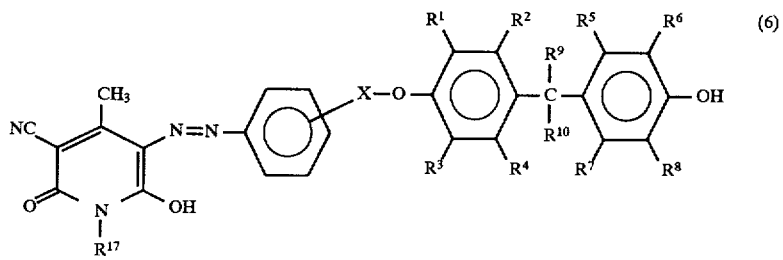

wherein $R^1$ to $R^{10}$ have the same meanings as defined in formula (1); $R^{17}$ represents an unsubstituted, linear or branched alkyl group having 1 to 20 carbon atoms or a linear or branched alkyl group substituted by one or more halogen, alkoxy, hydroxyl and/or amino-groups and having 1 to 30 carbon atoms in total; and X represents —CO— or —COOCH$_2$CO—.

Where X represents a divalent connecting group in formula (1), no particular limitation is imposed on the divalent connecting group and any divalent connecting group can be used. Preferred examples of the divalent connecting group include alkylene groups such as methylene, ethylene, methylethylene, 1,2-dimethylethylene, propylene, butylene, methoxymethylethylene and hexylene; diesters such as —COOCH$_2$CO—, —COOCH$_2$CH$_2$CO—, —COOCH$_2$CH$_2$CH$_2$CO—, —COOCH(CH$_3$)CH$_2$CO— and —COOCH$_2$CH(CH$_3$)CO—; —NHCO—; and —CO—.

As a process for the synthesis of the dyestuff represented by formula (1), a compound represented by the below-described formula (8) and another compound represented by the below-described formula (9) are reacted, for example, under heat at 50–°200° C. for about 0.5–20 hours in the presence of a base such as potassium carbonate, sodium carbonate, sodium hydroxide, potassium hydroxide, sodium acetate or potassium acetate either in a solventless manner or in a solvent, for example, an aromatic hydrocarbon such as benzene, toluene or xylene, a halogenated hydrocarbon such as chlorobenzene or dichlorobenzene, a sulfur-containing solvent such as sulfolane or dimethylsulfoxide, an amide solvent such as dimethylformamide or dimethylacetamide, a Cellosolve solvent such as Ethyl Cellosolve, Methyl Cellosolve or Butyl Cellosolve, 1,3-dimethyl-2-imidazolidinone, or N-methylpyrrolidone.

Formula (8) being:

Dye-Br    (8)

wherein Dye represents a chromophoric nucleus.

Formula (9) being:

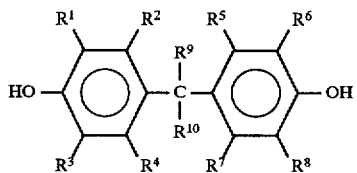    (9)

wherein $R^1$ to $R^{10}$ have the same meaning as defined in the formula (1).

The term "resin composition" as used herein means a photoresist composition which is used upon fabrication of color filters for LCDs or color separation filters for image pickup tubes. The photoresist composition is formed of (1) a dyestuff, (2) a binder polymer, (3) a photopolymerizable polyfunctional monomer, (4) a photopolymerization initiator, and (5) other additives. The photoresist composition can be diluted with a solvent, for example, an acetate such as ethyl cellosolve acetate, methyl cellosolve acetate, butyl cellosolve acetate, butyl cellosolve acetate or propylene glycol monomethyl ether acetate, a lactate ester such as ethyl lactate, methyl lactate, propyl lactate or butyl lactate, a pylvate ester such as ethyl pylvate, methyl pylvate, propyl pylvate or butyl pylvate, a ketone such as methyl-2-n-amyl ketone, methyl ethyl ketone or cyclohexanone, or an ester such as butyl acetate, ethyl acetate, methyl acetate, propyl acetate or methyl 3-methoxypropionate.

(1) The dyestuff can be used in an amount of 1–100 parts, preferably 10–40 parts per 100 parts of the binder polymer. Two or more dyestuffs according to the present invention can be used in combination. It is also possible to additionally incorporate one or more color-adjusting dyestuffs.

(2) The binder polymer is to impart film-forming ability to the photoresist. An alkali-developable binder polymer contains acid groups (carboxyl groups) and can be dissolved in an alkali developer. Examples of such binder polymers can include various copolymers containing methyl methacrylate as a principal component, polystyrene, acrylonitrile, (meth)acrylic acids and the like.

(3) The photopolymerizable polyfunctional monomer undergoes radical polymerization in the presence of a photoinitiator and tangles the binder polymer to cross-link and cure the same, whereby the binder polymer is rendered insoluble in the developer. The photopolymerizable polyfunctional monomer can be used in an amount of 1–100 parts, preferably 10–50 parts per 100 parts of the binder polymer. Examples of such monomers can include polyfunctional (meth)acrylates such as trimethylolpropane triacrylate, polyethylene glycol di(meth)acrylates, polyalkylene glycol di(meth)acrylates and (di)pentaerythritol (tri to hexa)acrylates as well as polyfunctional (meth)acrylates of the epoxy, urethane, ester, ether, bisphenol and spiran types.

(4) The photopolymerization initiator, upon exposure to ultraviolet rays, generates active radicals as an initiator or sensitizer and induces radical polymerization of a polyfunctional monomer containing polymerizable groups such as (meth)acryloyl groups. The photopolymerization initiator can be used in an amount of 0.01–100 parts, preferably 1–20 parts per 100 parts of the binder resin. Examples of such photopolymerization initiators include intermolecular hydrogen abstraction type photopolymerization initiators, such as those of the benzophenone, thioxanthone and anthraquinone type, and intramolecular linkage cleaving type photopolymerization initiators such as those of the acetophenone and benzoin ether types.

(5) Other additives include polymerization inhibitors such as those of the hydroquinone and bisphenol types.

From dyestuffs according to this invention, a color filter for an LCD or a color separation filter for an image pickup tube can be fabricated, for example, by casting or spin-coating a photosensitive resin or photopolymerizable monomer in the form of film on a substrate, exposing the film to light to pattern the same and then dyeing the resin layer with the dyestuff by dipping or a like method, by vacuum-depositing a dyestuff layer and patterning it in accordance with dry etching or lifting-off, by dissolving or dispersing the dyestuff beforehand in a resist composition or, forming the resulting solution or dispersion into a film on a substrate in accordance with casting, spin-coating or the like and then exposing the film to light to pattern the same, or by patterning the dyestuff on a substrate in accordance with a printing process.

Such patterning of a dyestuff layer as described above can be conducted on an optically transparent substrate. No particular limitation is imposed on the substrate to be used, insofar as the substrate permits patterning of a dyestuff layer and the color filter so formed has predetermined function.

Illustrative usable substrates can include glass plates; and resin films and plates made of polyvinyl alcohol, hydroxyethylcellulose, polymethyl methacrylate, polyesters, polybutyral, polyamides, polyethylene, polyvinyl chloride, polyvinylidene chloride, polycarbonates, copolymers containing polyolefins, polyvinyl chloride, polyvinylidene chloride or polystyrene. A patterned dyestuff layer can also be formed integrally with a substrate which is applicable as a color filter. Examples of this substrate can include the luminescent screen of a cathode-ray tube, the light receiving surface of an image pickup tube, a wafer with solid-state image pickup elements formed thereon, a contact image sensor making use of a thin film semiconductor, a display surface for LCD and a photoconductor for color electrophotography.

Taking the formation of a stripe filter as an example, a typical process for the formation of a filter will hereinafter be described with reference to FIG. 1.

As is shown at (B) in FIG. 1, a resin composition which has been formed by dissolving or dispersing 1–20 parts of a dyestuff of this invention in 100 parts of a solution obtained by diluting 20 parts of a photoresist composition with 80 parts of a solvent is first spin-coated by a spinner on a glass substrate 1 [(A) in FIG. 1] on which a black matrix 2 has been formed in advance. Although the thickness of a resist layer 3 is determined depending on the desired spectral characteristic, it is generally 0.5–100 μm, preferably 1–2 μm. After the coating, the resist layer is pre-baked under adequate temperature conditions (step 1). Through a photomask 4 having a predetermined pattern shape corresponding to a pattern to be formed (stripe pattern), the pre-baked resist layer is exposed to light or electron beams (ultraviolet rays in the drawing) to which the resist is sensitive [(C) in FIG. 1, step 2]. The resist layer so exposed is then developed to form a colored pattern 5 [(D) in FIG. 1]. It is also possible to apply, as needed, pretreatment before the development to reduce distortion of the resist layer or rinsing treatment after the development to suppress expansion of the resultant film. Finally, post-baking is conducted under suitable conditions (step 3).

To form a color filter having two or more colors, a serial procedure of steps (1) to (3) is repeated as many as needed depending on the number of the colors employed for the filter while separately using dyestuffs corresponding to the respective colors. This makes it possible to provide the color filter with the multiple colors. As is illustrated at (E) in FIG. 1, colored patterns 5,6,7 corresponding to three colors R,G,B, respectively, are formed. To form a black matrix, it is desired to form the black matrix before the individual dyestuff layers are formed.

From dyestuffs according to this invention, a color filter for use in a color copying machine or the like can be fabricated, for example, by mixing 0.1–10 parts of the dyestuff of this invention with 100 parts of a thermoplastic resin, for example, polystyrene, polymethyl methacrylate, a polycarbonate, a polyester, polyvinyl chloride, a polyacetal, a polyphenylene oxide, a polybutylene terephthalate, a polyethylene terephthalate, a vinyl alcohol copolymer, a polysulfone, a polyphenylene sulfide, a polyamide imide, a polyether imide or a polyetheretherketone and forming the resultant colored resin in accordance with injection molding, stretching or the like, by dissolving the dyestuff of this invention either singly or together with a binder in a solvent and forming the solution into a film on a substrate in accordance with casting, spin-coating or vacuum deposition, or by mixing the dyestuff with a varnish containing a polyimide resin intermediate and then heating the resulting mixture to form the intermediate into a resin.

Any optically transparent material can be used as the substrate. Illustrative materials include glass; and transparent resins, for example, polyacrylic resin, polyethylene resin, polyvinyl chloride resin, polyvinylidene chloride resin, polycarbonate resins, polyethylene resin, copolymers containing polyolefins, polyvinyl chloride, polyvinylidene chloride or polystyrene.

The present invention will hereinafter be described in detail by the following examples. It is however to be noted that embodiments for the practice of the present invention are by no means limited to or by the following examples.

EXAMPLE 1

Ten parts of 1-amino-2,4-dibromoanthraquinone, 50 parts of m-toluidine and 11.8 parts of sodium acetate were reacted at 130° C. for 5 hours. The reaction mixture was poured into 1000 parts of 50% aqueous methanol solution, whereby 9.5 parts of the following compound (10) were obtained.

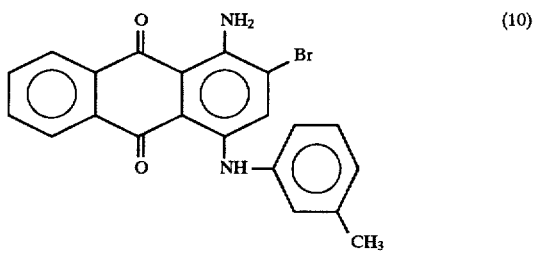

After 18.4 parts of 4,4'-butylidenebis(6-t-butyl-m-cresol), 7.2 parts of potassium carbonate and 100 parts of sulfolane were stirred at 100° C. for 30 minutes, 9 parts of the compound (10) were added, followed by a reaction at 120° C. for 4 hours. The reaction mixture was poured into 1000 parts of 50% aqueous methanol solution, and a precipitated solid was collected by filtration and then dried. By column chromatographic purification, 7 parts of the following compound (11) were obtained.

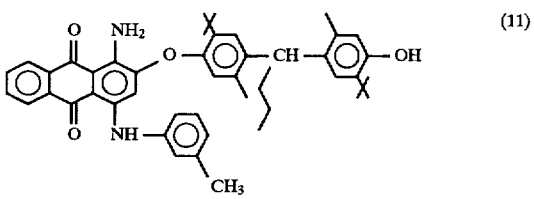

Melting point: 136–°164° C.

Visible light absorption, $\lambda_{max}$: 600 nm εg: $2.0 \times 10^4$ ml/g.cm (solvent: toluene)

Elemental analysis for $C_{47}H_{52}N_2O_4$:

|  | C | H | N |
| --- | --- | --- | --- |
| Calculated (%) | 79.66 | 7.34 | 3.96 |
| Found (%) | 79.56 | 7.46 | 3.95 |

One gram of the anthraquinone compound (11) was dissolved in 10 g of a prepolymer ("SD-17", trade name; product of Dainippon Ink & Chemicals, Incorporated). Using a spinner, the resulting solution was spin-coated on a glass substrate. The resulting film was dried, pre-baked at 85–°100° C. for 2–5 minutes and through a mask having a stripe-shaped pattern, exposed to light from a high-pressure mercury lamp (20–30 mj/cm², 2 minutes). The film so exposed was then developed to form a pattern. Finally, the film so patterned was post-baked at 200°–230° C. for 10–30 minutes so that a blue stripe filter was obtained. The thickness of the dyestuff layer was 2.1 μm.

The filter had good durability and transmittance characteristics. Its transmittance characteristics are shown in FIG. 2.

EXAMPLE 2

Ten parts of 1-amino-2,4-dibromoanthraquinone, 50 parts of cyclohexylamine and 11.8 parts of sodium acetate were reacted at 130° C. for 5 hours. The reaction mixture was poured into 1000 parts of 50% aqueous methanol solution, whereby 9.0 parts of the following compound (12) were obtained.

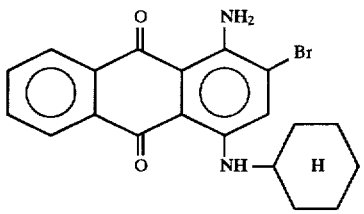
(12)

After 18.4 parts of 4,4'-butylidenebis (6-t-butyl-m-cresol), 7.2 parts of potassium carbonate and 100 parts of sulfolane were stirred at 100° C. for 30 minutes, 9 parts of the compound (12) were added, followed by a reaction at 120° C. for 4 hours. The reaction mixture was poured into 1000 parts of 50% aqueous methanol solution, and a precipitated solid was collected by filtration and then dried. By column chromatographic purification, 8.3 parts of the following compound (13) were obtained.

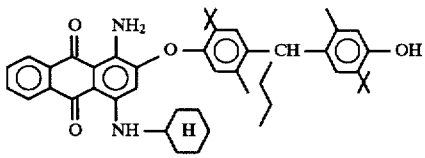
(13)

Visible light absorption, $\lambda_{max}$: 596 nm $\epsilon$g: $1.9 \times 10^4$ ml/g.cm (solvent: toluene)

Elemental analysis for $C_{46}H_{56}N_2O_4$:

|  | C | H | N |
|---|---|---|---|
| Calculated (%) | 78.86 | 8.00 | 4.00 |
| Found (%) | 78.82 | 8.05 | 4.11 |

In a vessel equipped with a stirrer and a nitrogen inlet tube, 36.8 parts of 4,4'-bis(2-aminophenoxy)biphenyl and 202 parts of N,N-dimethylformamide were charged. In a nitrogen atmosphere, 39.8 parts of 4,4'-(p-phenylenedioxy) diphthalic dianhydride were added in portions at room temperature, followed by stirring for 20 hours. To the resulting polyamic acid solution, 3.0 parts of the compound (13) were added and mixed. The solution so obtained was cast on a glass plate, followed by heat treatment at 200° C. for 5 hours. The filter so obtained had good transmittance characteristics and excellent heat resistance and moisture resistance. Its transmittance characteristics are shown in FIG. 3.

EXAMPLE 3

Ten parts of 1-amino-2,4-dibromoanthraquinone, 50 parts of 2,4-xylidine and 11.8 parts of sodium acetate were reacted at 130° C. for 5 hours. The reaction mixture was poured into 1000 parts of 50% aqueous methanol solution, whereby 9.3 parts of the following compound (14) were obtained.

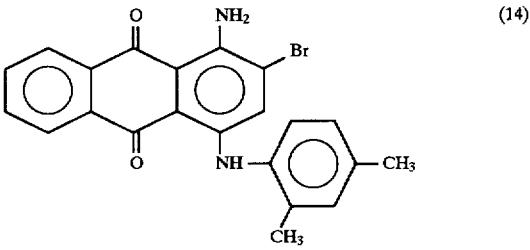
(14)

After 18.4 parts of 4,4'-butylidenebis(6-t-butyl-m-cresol), 7.2 parts of potassium carbonate and 100 parts of sulfolane were stirred at 100° C. for 30 minutes, 9 parts of the compound (14) were added, followed by a reaction at 120° C. for 4 hours. The reaction mixture was poured into 1000 parts of 50% aqueous methanol solution, and a precipitated solid was collected by filtration and then dried. By column chromatographic purification, 8.0 parts of the following compound (15) were obtained.

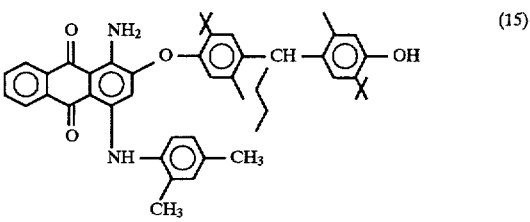
(15)

Visible light absorption, $\lambda_{max}$: 602 nm $\epsilon$g: $1.9 \times 10^4$ ml/g.cm (solvent: toluene)

Elemental analysis for $C_{48}H_{54}N_2O_4$:

|  | C | H | N |
|---|---|---|---|
| Calculated (%) | 79.78 | 7.48 | 3.88 |
| Found (%) | 79.75 | 7.55 | 3.84 |

To 100 g of polystyrene, 1 g of the anthraquinone compound (15) was added. The resultant resin composition was injection molded so that a filter was fabricated. The filter had good durability and transmittance characteristics. Its transmittance spectrum is depicted in FIG. 4.

COMPARATIVE EXAMPLE 1

Using the dyestuff disclosed in Japanese Patent Laid-Open No. 197459/1987, a filter was fabricated in a similar manner to Example 3. Characteristics of the filter were presented in Table 1, and a transmittance spectrum of the filter is depicted in FIG. 5.

COMPARATIVE EXAMPLE 2

Figure 6:
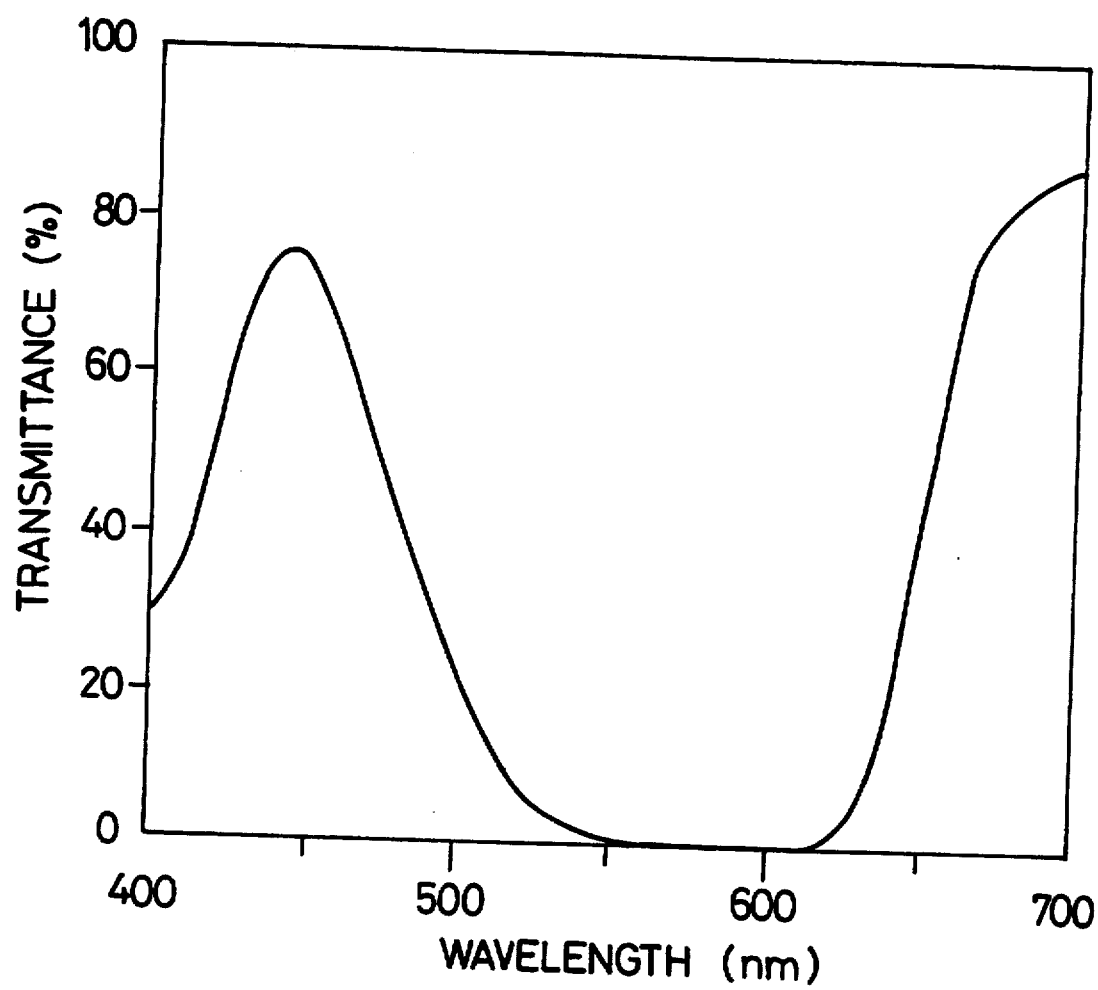
FIG. 6 diagrammatically shows transmittance characteristics of a filter obtained in Comparative Example 2.

Gelatin was colored with Acid Blue 90 to fabricate a filter. Characteristics of the gelatin filter are presented in Table 1, and a transmittance spectrum of the gelatin filer is depicted in FIG. 6.

Measuring methods of individual characteristics and the presentation of the measurement results were as follows.

1. Transmittance characteristics

When the transmittance was 10% or lower at (the wavelength for a maximum transmittance ±80) nm and the maximum transmittance is 80% or higher: A When the transmittance was 10% or lower at (the wavelength for the maximum transmittance ±80) nm and the maximum transmittance is 70% or lower: B 2. Moisture resistance In terms of a color difference ΔE in 100 hours at 80% humidity and 60° C., when ΔE≦3: A when ΔE≧5: B 3. Light fastness In terms of a color difference ΔE in 100 hours at 60° C. on a fadeometer, when ΔE≦3: A when ΔE≧5: B 4. Heat resistance In terms of a color difference ΔE in 1 hour at 250° C., when ΔE≦3: A when ΔE≧5: B

TABLE 1

|  | Transmittance characteristics | Moisture resistance | Light fastness | Heat resistance |
| --- | --- | --- | --- | --- |
| Ex. 1 | A (FIG. 2) | A | A | A |
| Ex. 3 | A (FIG. 4) | A | A | A |
| Comp.[1] Ex. 1 | B (FIG. 5) | A | B | A |
| Comp.[2] Ex. 2 | A (FIG. 6) | B | B | B |

[1]Fabricated in a similar manner to Example 3 by using the dyestuff (of the below-described structural formula) of Japanese Patent Application Laid-Open No. 197459/1987:

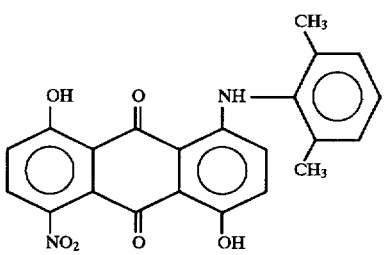

[2]Filter obtained by coloring gelatin with the dyestuff, Acid Blue 90, disclosed on page 48 of "1990s Development and Market Trend of Special Functional Dyestuffs", CMC Co., Ltd.

EXAMPLE 4

Ten parts of 1-amino-2,4-dibromoanthraquinone, 50 parts of ethanolamine and 11.8 parts of sodium acetate were reacted at 130° C. for 5 hours. The reaction mixture was poured into 1000 parts of 50% aqueous methanol solution, whereby 9.0 parts of the following compound (16) were obtained.

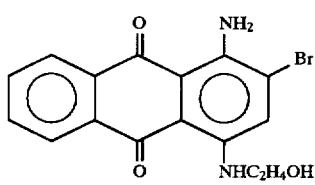

After 18.4 parts of 4,4'-butylidenebis(6-t-butyl-m-cresol), 7.2 parts of potassium carbonate and 100 parts of sulfolane were stirred at 100° C. for 30 minutes, 9 parts of the compound (16) were added, followed by a reaction at 120° C. for 4 hours. The reaction mixture was poured into 1000 parts of 50% aqueous methanol solution, and a precipitated solid was collected by filtration and then dried. By column chromatographic purification, 8.2 parts of the following compound (17) were obtained.

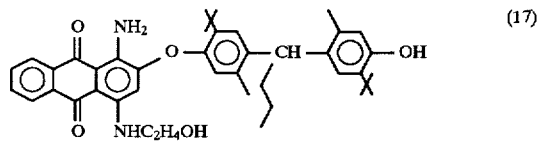

Visible light absorption, $\lambda_{max}$: 595 nm εg: $2.1 \times 10^4$ ml/g.cm (solvent: toluene)

Elemental analysis for $C_{42}H_{50}N_2O_5$:

|  | C | H | N |
| --- | --- | --- | --- |
| Calculated (%) | 76.13 | 7.55 | 4.23 |
| Found (%) | 76.02 | 7.59 | 4.22 |

To 100 g of polystyrene, 1 g of the anthraquinone compound (17) was added. The resultant resin composition was injection molded so that a filter was fabricated. The filter had good durability and transmittance characteristics.

EXAMPLE 5

Ten parts of 1-amino-2-bromo-4-hydroxyanthraquinone, 12 parts of 4,4'-butylidenebis(6-tert-butyl-m-cresol) and 3.52 parts of potassium hydroxide were reacted at 80° C. for 3 hours in 50 parts of sulfolane. The reaction mixture was poured into 500 parts of a 50% aqueous methanol solution, whereby 8.9 parts of the following anthraquinone compound (18) were obtained.

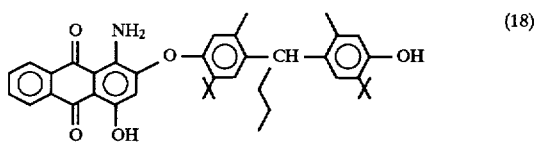

Visible light absorption, $\lambda_{max}$: 515 nm εg: $2.4 \times 10^4$ ml/g.cm (solvent: toluene)

Elemental analysis for $C_{40}H_{45}NO_5$:

|  | C | H | N |
| --- | --- | --- | --- |
| Calculated (%) | 77.54 | 7.27 | 2.26 |
| Found (%) | 77.58 | 7.35 | 2.18 |

Figure 7:
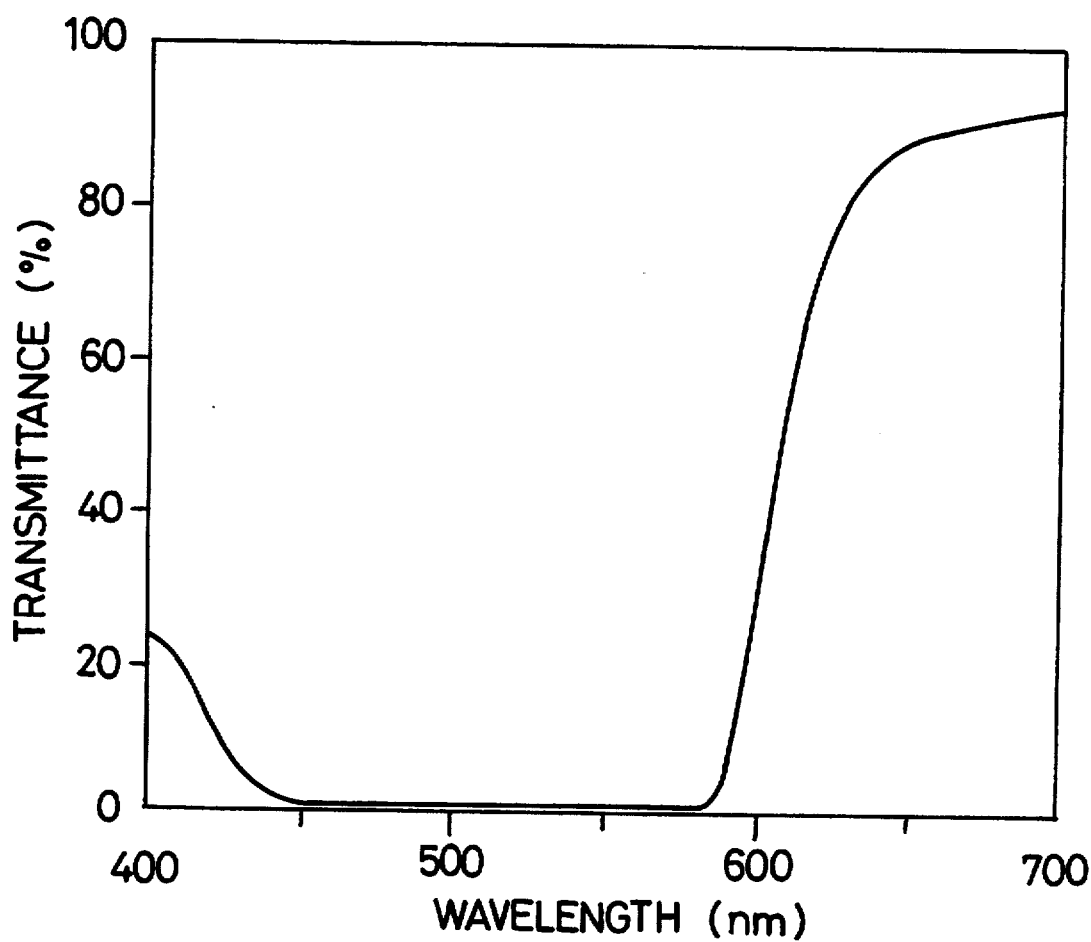
FIG. 7 diagrammatically depicts transmittance characteristics of a filter obtained in Example 5.

To 100 parts of polyvinyl chloride, 1 part of the compound (18) was added. The resultant resin composition was injection molded so that a filter was fabricated. The filter was good in both durability and transmittance characteristics. Characteristics of the filter are presented in Table 2, and the transmittance characteristics of the filter are depicted in FIG. 7.

EXAMPLE 6

After 22.3 parts of 4,4'-butylidenebis(2-t-butylphenol), 4.8 parts of potassium carbonate and 100 parts of sulfolane were stirred at 80° C. for 30 minutes, 10 parts of 1-amino-2-bromo-4-hydroxyanthraquinone were added, followed by a reaction at 125° C. for further 6 hours. The reaction mixture was poured into 1000 parts of ice water, and a precipitated solid was collected by filtration and then dried. By column chromatographic purification, 13 parts of the following compound (19) were obtained.

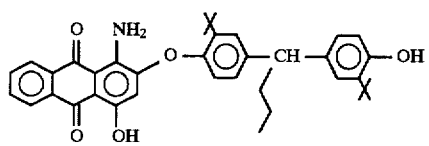

(19)

Visible light absorption, $\lambda_{max}$: 515 nm εg: 2.0×10⁴ ml/g.cm (solvent: toluene)

Elemental analysis for $C_{38}H_{41}NO_5$:

|  | C | H | N |
|---|---|---|---|
| Calculated (%) | 81.57 | 7.33 | 2.50 |
| Found (%) | 81.45 | 7.41 | 2.45 |

One part of the anthraquinone compound (19) was dissolved in 25 parts of the below-described composition. Using a spinner, the resulting solution was spin-coated on a glass substrate. The resulting film was dried, pre-baked at 85°–100° C. for 2–5 minutes and through a mask having a stripe-shaped pattern, exposed to light from a high-pressure mercury lamp (20–30 mj/cm², 2 minutes). The film so exposed was then developed to form a pattern. Finally, the film so patterned was post-baked at 200°–230° C. for 10–30 minutes so that a red stripe filter was obtained. The thickness of the dyestuff layer was 2.2 μm.

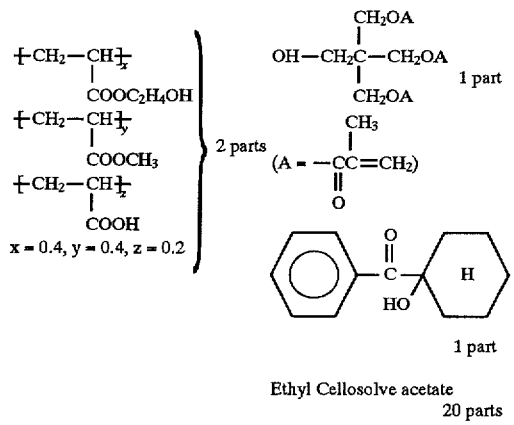

Ethyl Cellosolve acetate
20 parts

The filter had good durability and transmittance characteristics. Its transmittance characteristics are shown in FIG. 8.

COMPARATIVE EXAMPLE 3

Figure 9:
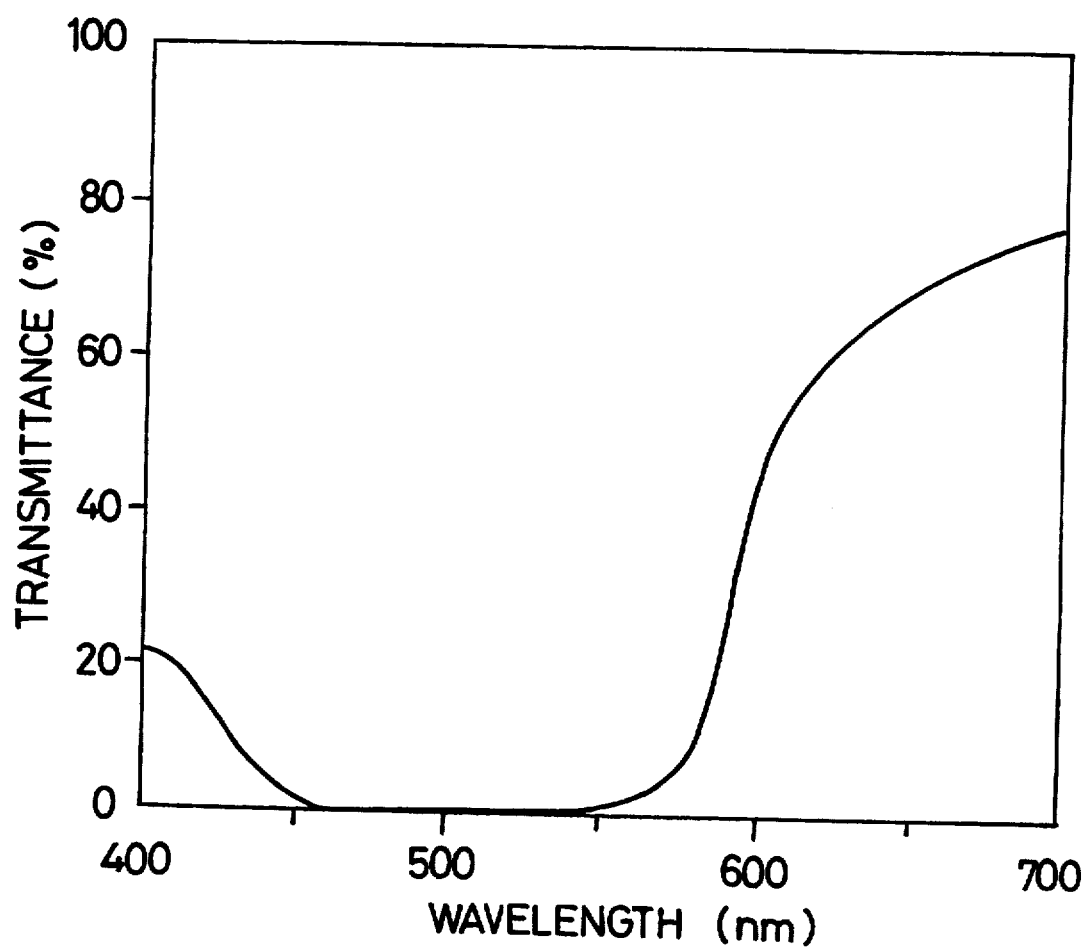
FIG. 9 diagrammatically presents transmittance characteristics of a filter obtained in Comparative Example 3.

Using the dyestuff of the below-described structural formula disclosed in Japanese Patent Laid-Open No. 108068/1987, a filter was fabricated in a similar manner to Example 6. Characteristics of the filter are presented in Table 2, and transmittance characteristics of the filter are depicted in FIG. 9. In the filter so obtained, the dyestuff was insoluble in the binder polymer and precipitated in the form of a solid.

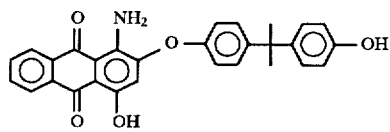

TABLE 2

|  | Transmittance characteristics | Moisture resistance | Light fastness | Heat resistance |
|---|---|---|---|---|
| Ex. 5 | A (FIG. 7) | A | A | A |
| Ex. 6 | A (FIG. 8) | A | A | A |
| Comp.[1] Ex. 3 | B (FIG. 9) | A | A | A |

[1]Fabricated in a similar manner to Example 6 by using the dyestuff of Japanese Patent Laid-Open No. 108068/1987:

EXAMPLE 7

In a vessel equipped with a stirrer, reflux condenser and a nitrogen inlet tube, were charged 10 parts of the below-described compound (20), 2.8 parts of 1,8-diazabicyclo[5.4.0]-7-undecene and 100 parts of n-amyl alcohol:

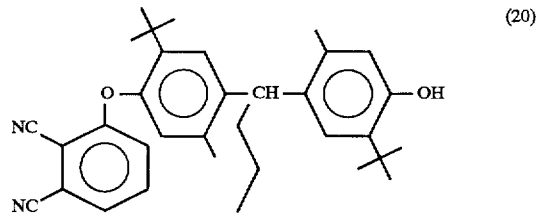

(20)

In a nitrogen atmosphere, the contents of the vessel was heated to 110° C. At the same temperature, 0.6 part of cuprous chloride was next added, followed by a reaction at 110°–120° C. for 8 hours. After completion of the reaction, the reaction mixture was cooled and insoluble matter was then removed by filtration. The filtrate was concentrated under reduced pressure to remove the solvent. By column chromatographic purification, 9.2 parts of the following compound (21) and its isomers were obtained.

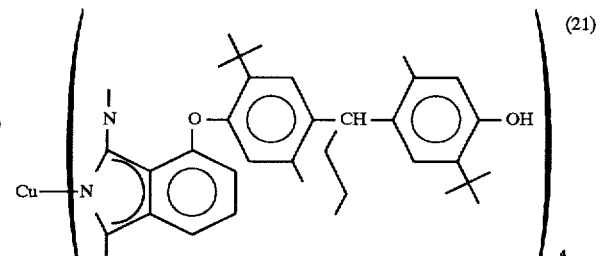

(21)

Visible light absorption, $\lambda_{max}$: 706 nm εg: 1.0×10⁵ ml/g.cm (solvent: toluene)

Elemental analysis for $C_{136}H_{160}N_8O_8Cu$:

|  | C | H | N |
|---|---|---|---|
| Calculated (%) | 77.88 | 7.64 | 5.34 |
| Found (%) | 77.77 | 7.80 | 5.31 |

In a vessel equipped with a stirrer and a nitrogen inlet tube, 36.8 parts of 4,4'-bis(2-aminophenoxy)biphenyl and 202 parts of N,N-dimethylformamide were charged. In a nitrogen atmosphere, 39.8 parts of 4,4'-(p-phenylenedioxy)diphthalic dianhydride were added in portions at room temperature, followed by stirring for 20 hours. To the resulting polyamic acid solution, 3.0 parts of the compound (21) were added and mixed. The solution so obtained was cast on a glass plate, followed by heat treatment at 200° C. for 5 hours. The filter so obtained had good transmittance characteristics and excellent heat resistance and moisture resistance. Its transmittance characteristics are shown in FIG. 10.

EXAMPLE 8

In a vessel equipped with a stirrer, reflux condenser and a nitrogen inlet tube, were charged 10 parts of the below-described compound (22), 3.2 parts of 1,8-diazabicyclo [5.4.0]-7-undecene and 100 parts of n-amyl alcohol:

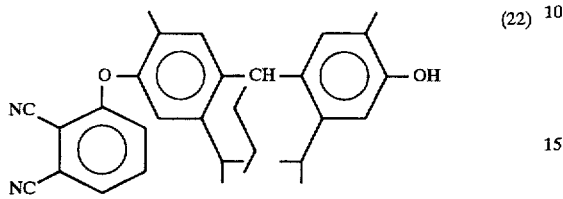
(22)

In a nitrogen atmosphere, the contents of the vessel was heated to 110° C. At the same temperature, 1.1 parts of palladium chloride were next added, followed by a reaction at 110°–120° C. for 8 hours. After completion of the reaction, the reaction mixture was cooled and insoluble matter was then removed by filtration. The filtrate was concentrated under reduced pressure to remove the solvent. By column chromatographic purification, 8.1 parts of the following compound (23) and its isomers were obtained.

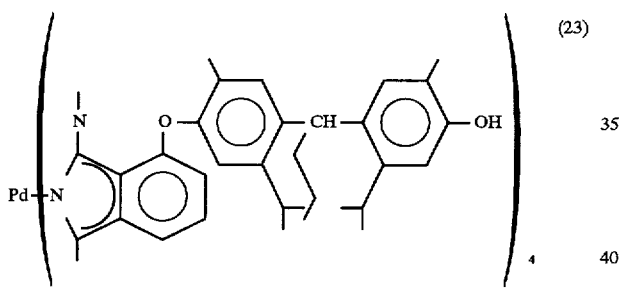
(23)

Visible light absorption, $\lambda_{max}$: 703 nm $\epsilon g$: 1.1×10$^5$ ml/g.cm (solvent: toluene)

Elemental analysis for $C_{128}H_{144}N_8O_8Pd$:

|  | C | H | N |
|---|---|---|---|
| Calculated (%) | 75.80 | 7.11 | 5.53 |
| Found (%) | 75.71 | 7.20 | 5.47 |

One part of the phthalocyanine (23) was dissolved in 25 parts of the below-described composition. Using a spinner, the resulting solution was spin-coated on a glass substrate. The resulting film was dried, prebaked at 85°–100° C. for 2–5 minutes and through a mask having a stripe-shaped pattern, exposed to light from a high-pressure mercury lamp (20–30 mj/cm$^2$, 2 minutes). The film so exposed was then developed to form a pattern. Finally, the film so patterned was post-baked at 200°–230° C. for 10–30 minutes so that a stripe filter was obtained. The thickness of the dyestuff layer was 2 μm.

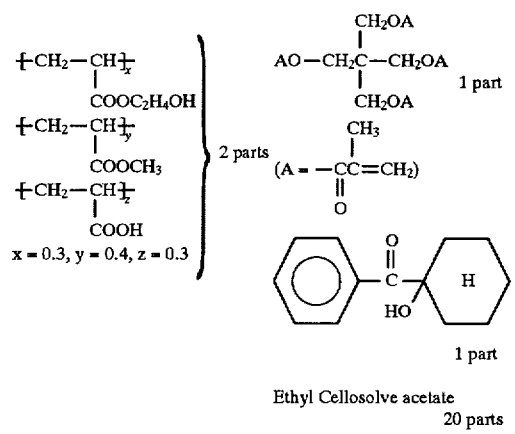

Ethyl Cellosolve acetate
20 parts

Figure 11:
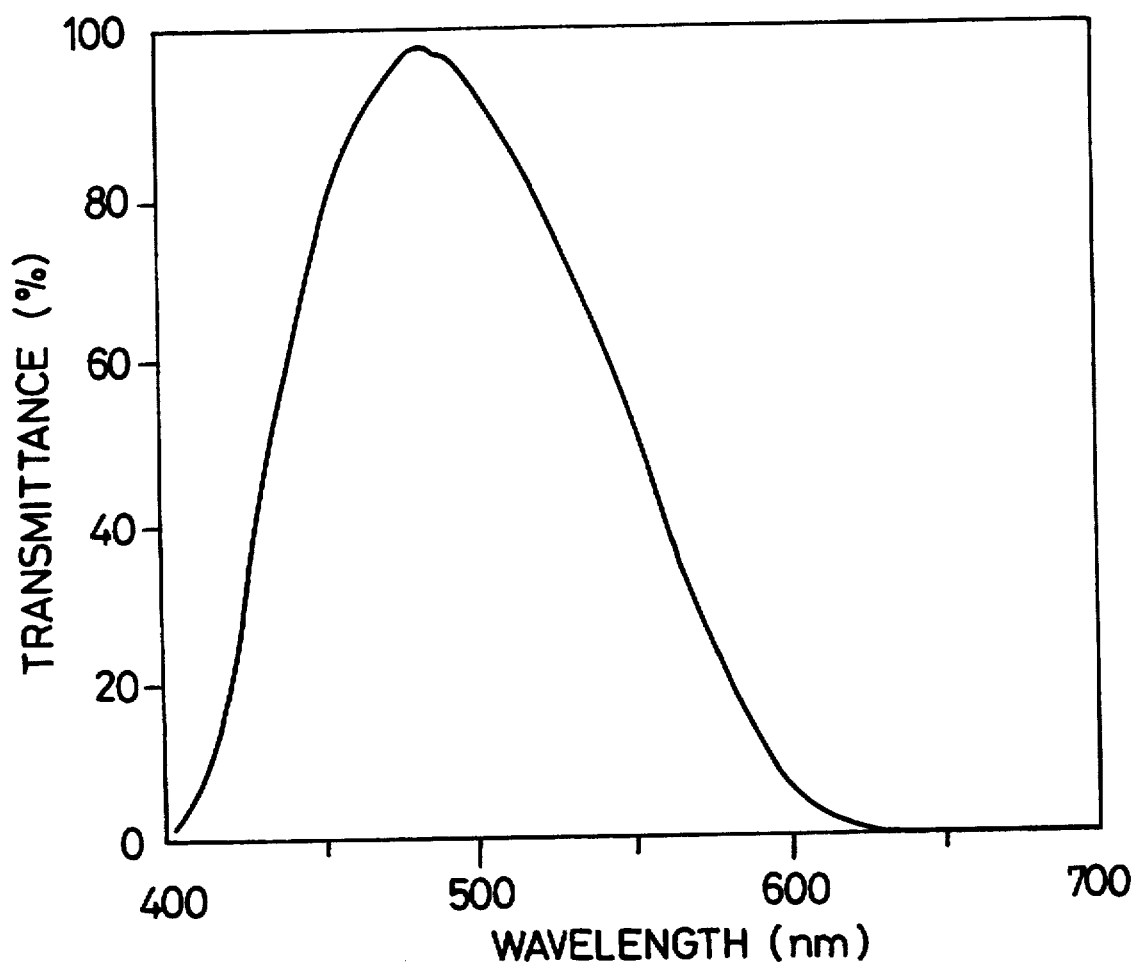
FIG. 11 diagrammatically depicts transmittance characteristics of a filter obtained in Example 8.

The filter had good durability and transmittance characteristics. Its transmittance characteristics are shown in FIG. 11.

EXAMPLE 9

In a vessel equipped with a stirrer, reflux condenser and a nitrogen inlet tube, were charged 10 parts of the below-described compound (24), 3.4 parts of 1,8-diazabicyclo [5.4.0]-7-undecene and 100 parts of n-amyl alcohol:

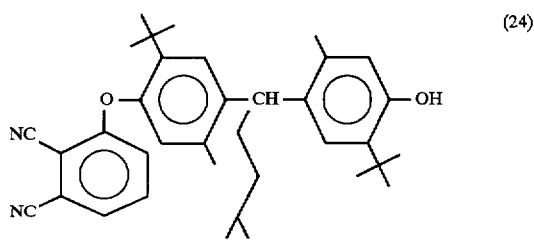
(24)

In a nitrogen atmosphere, the contents of the vessel was heated to 110° C. At the same temperature, 0.7 part of cuprous chloride was next added, followed by a reaction at 110°–120° C. for 8 hours. After completion of the reaction, the reaction mixture was cooled and insoluble matter was then removed by filtration. The filtrate was concentrated under reduced pressure to remove the solvent. By column chromatographic purification, 10.3 parts of the following compound (25) and its isomers were obtained.

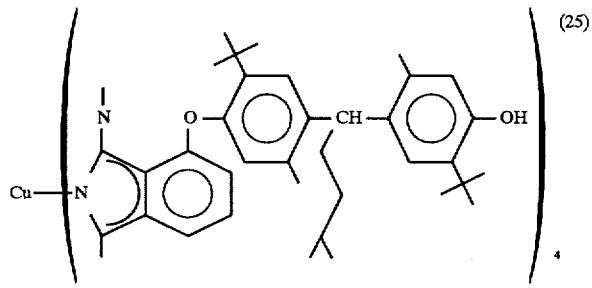
(25)

Visible light absorption, $\lambda_{max}$: 706 nm $\epsilon g$: 0.9×10$^5$ ml/g.cm (solvent: toluene)

23

Elemental analysis for $C_{144}H_{176}N_8O_8Cu$:

|  | C | H | N |
|---|---|---|---|
| Calculated (%) | 78.28 | 7.97 | 5.80 |
| Found (%) | 78.30 | 8.05 | 5.74 |

To 100 g of polyvinyl chloride, 1 g of the compound (25) was added. The resultant resin composition was injection molded so that a filter was fabricated. The filter was good in both durability and transmittance characteristics.

EXAMPLE 10

In a vessel equipped with a stirrer, reflux condenser and a nitrogen inlet tube, were charged 10 parts of the below-described compound (26), 3.5 parts of 1,8-diazabicyclo [5.4.0]-7-undecene and 100 parts of n-amyl alcohol:

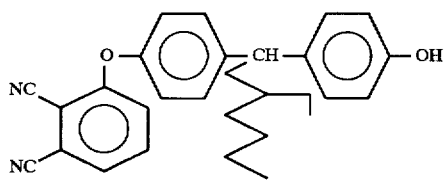
(26)

In a nitrogen atmosphere, the contents of the vessel was heated to 110° C. At the same temperature, 0.7 part of cuprous chloride was next added, followed by a reaction at 110°–120° C. for 8 hours. After completion of the reaction, the reaction mixture was cooled and insoluble matter was then removed by filtration. The filtrate was concentrated under reduced pressure to remove the solvent. By column chromatographic purification, 9.7 parts of the mixture of the following compound (27) and its isomers were obtained.

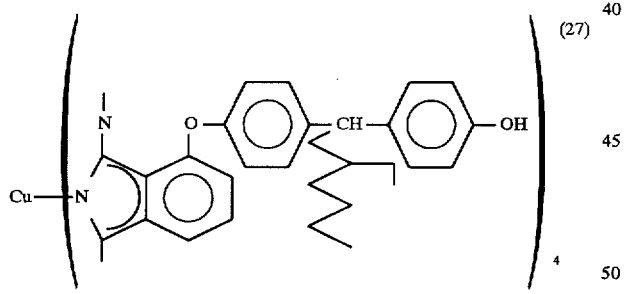
(27)

Visible light absorption, $\lambda_{max}$: 704 nm $\epsilon g$: $1.0 \times 10^5$ ml/g.cm (solvent: toluene)

24

Elemental analysis for $C_{116}H_{120}N_8O_8Cu$:

|  | C | H | N |
|---|---|---|---|
| Calculated (%) | 76.67 | 6.61 | 6.17 |
| Found (%) | 76.61 | 6.72 | 6.20 |

To 100 g of polymethyl methacrylate, 1 g of the compound (27) was added. The resultant resin composition was injection molded so that a filter was fabricated. The filter was good in both durability and transmittance characteristics.

EXAMPLE 11

In a vessel equipped with a stirrer, reflux condenser and a nitrogen inlet tube, were charged 10 parts of the below-described compound (28), 15.5 parts of the below-described compound (29), 4.3 parts of potassium carbonate, 0.2 part of KI and 70 parts of N,N-dimethylformamide:

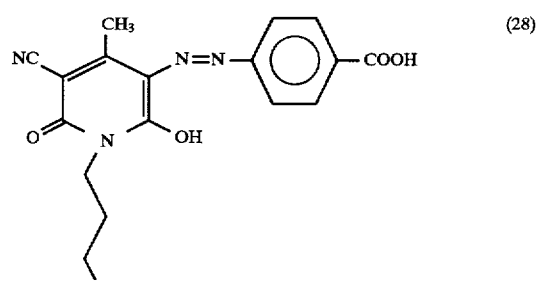
(28)

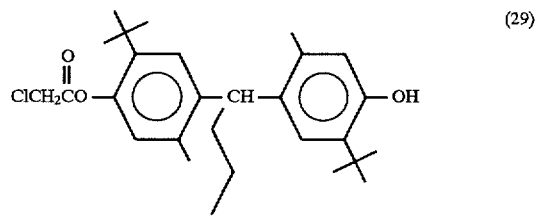
(29)

In a nitrogen atmosphere, the contents were reacted at 80° C. for 4 hours. After completion of the reaction, the reaction mixture was poured into 1000 parts of ice water and a precipitated solid was collected by filtration and then dried. By column chromatographic purification, 12 parts of the following compound (30) were obtained.

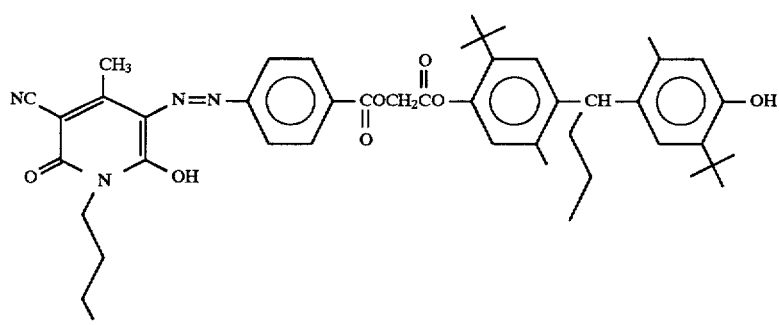
(30)

Visible light absorption, $\lambda_{max}$: 434 nm εg: $4.7\times10^4$ ml/g.cm (solvent: toluene)

Elemental analysis for $C_{46}H_{56}N_4O_7$:

|  | C | H | N |
|---|---|---|---|
| Calculated (%) | 71.13 | 7.22 | 1.22 |
| Found (%) | 71.11 | 7.25 | 7.25 |

One part of the azo compound (30) was dissolved in 25 parts of the below-described composition. Using a spinner, the resulting solution was spin-coated on a glass substrate. The resulting film was dried, pre-baked at 85°–100° C. for 2–5 minutes and through a mask having a stripe-shaped pattern, exposed to light from a high-pressure mercury lamp (20–30 mj/cm$^2$, 2 minutes). The film so exposed was then developed to form a pattern. Finally, the film so patterned was post-baked at 200°–230° C. for 10–30 minutes so that a stripe filter was obtained. The thickness of the dyestuff layer was 2.1 μm.

described compound (31), 15.0 parts of the above-described compound (29), 4.5 parts of potassium carbonate, 0.1 part of KI and 80 parts of N,N-dimethylformamide:

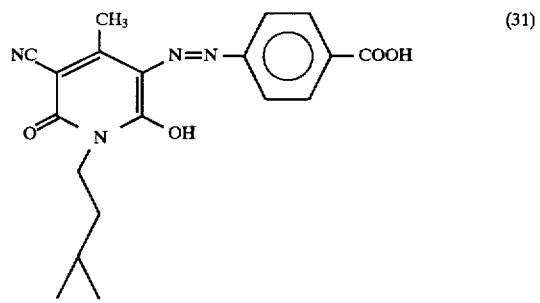

(31)

In a nitrogen atmosphere, the contents were reacted at 80° C. for 4 hours. After completion of the reaction, the reaction mixture was poured into 1000 parts of ice water and a precipitated solid was collected by filtration and then dried. By column chromatographic purification, 11 parts of the following compound (32) were obtained.

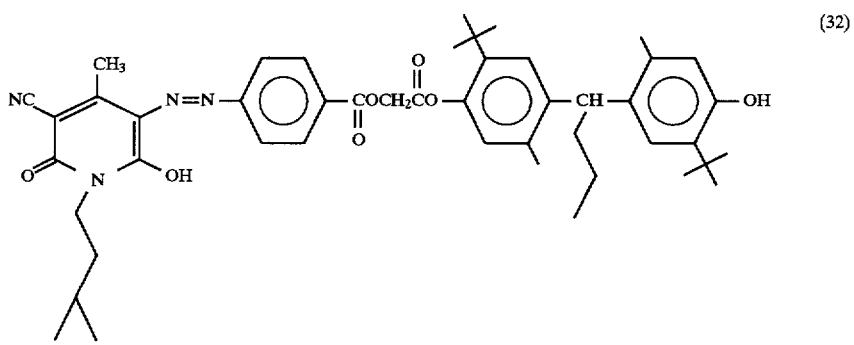

(32)

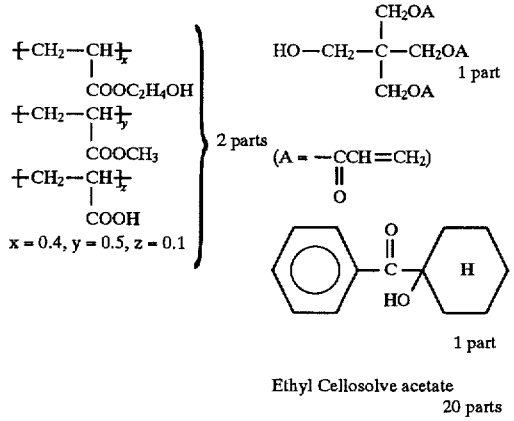

The filter had good durability and transmittance characteristics.

EXAMPLE 12

In a vessel equipped with a stirrer, reflux condenser and a nitrogen inlet tube, were charged 10 parts of the below- Visible light absorption, $\lambda_{max}$: 432 nm εg: $4.8\times10^4$ ml/g.cm (solvent: toluene)

Elemental analysis for $C_{47}H_{56}N_4O_7$:

|  | C | H | N |
|---|---|---|---|
| Calculated (%) | 71.39 | 7.34 | 7.09 |
| Found (%) | 71.45 | 7.35 | 7.05 |

To 100 parts of polymethyl methacrylate, 1 part of the compound (32) was added. The resultant resin composition was injection molded so that a filter was fabricated. The filter was good in both durability and transmittance characteristics.

EXAMPLE 13

In a vessel equipped with a stirrer, reflux condenser and a nitrogen inlet tube, were charged 10 parts of the below-described compound (33), 9.9 parts of the below-described compound (34), 3.7 parts of potassium carbonate, 0.3 part of KI and 80 parts of N,N-dimethylformamide:

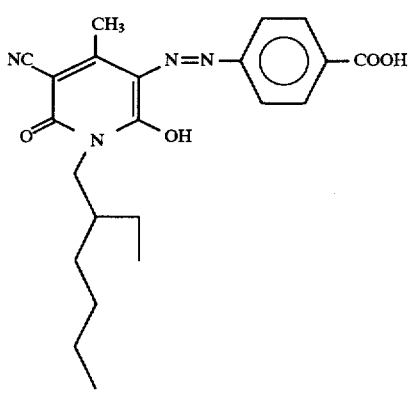
(33)

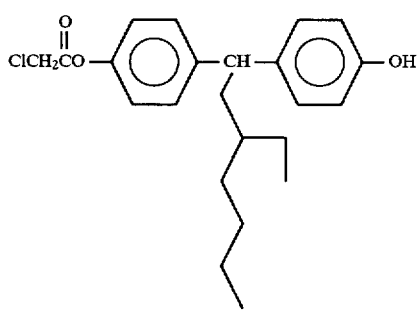
(34)

In a nitrogen atmosphere, the contents were reacted at 80° C. for 4 hours. After completion of the reaction, the reaction mixture was poured into 1000 parts of ice water and a precipitated solid was collected by filtration and then dried. By column chromatographic purification, 11.2 parts of the following compound (35) were obtained.

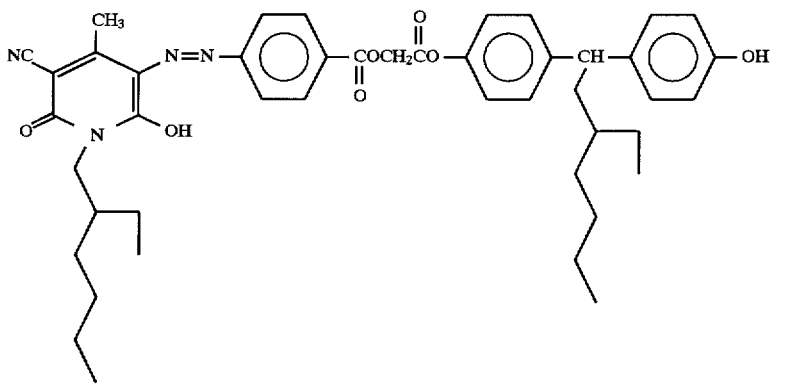
(35)

Visible light absorption, $\lambda_{max}$: 435 nm εg: $4.6 \times 10^4$ ml/g.cm (solvent: toluene)

Elemental analysis for $C_{43}H_{52}N_4O_5$:

|  | C | H | N |
|---|---|---|---|
| Calculated (%) | 73.30 | 7.39 | 7.95 |
| Found (%) | 73.25 | 7.45 | 7.99 |

To 100 parts of polyvinyl chloride, 1 part of the compound (35) was added. The resultant resin composition was injection molded so that a filter was fabricated. The filter was good in both durability and transmittance characteristics.

EXAMPLE 14

In a vessel equipped with a stirrer, reflux condenser and a nitrogen inlet tube, were charged 10 parts of the below-described compound (36), 18.3 parts of the below-described compound (37), 4.5 parts of potassium carbonate, 0.2 part of KI and 100 parts of N,N-dimethylformamide:

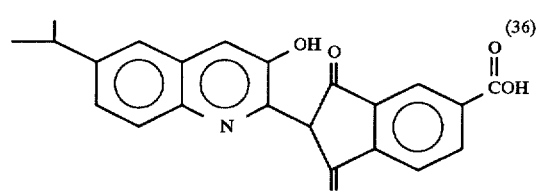
(36)

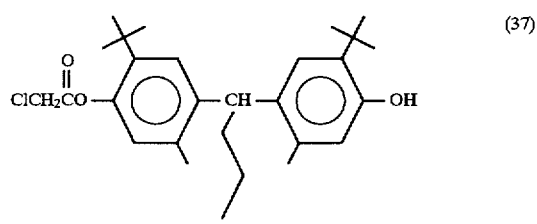
(37)

In a nitrogen atmosphere, the contents were reacted at 80° C. for 5 hours. After completion of the reaction, the reaction mixture was poured into 1000 parts of ice water and a precipitated solid was collected by filtration and then dried. By column chromatographic purification, 11.2 parts of the following compound (38) were obtained.

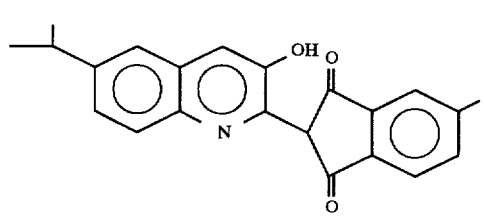

Visible light absorption, $\lambda_{max}$: 450 nm εg: $5.5 \times 10^4$ ml/g.cm (solvent: toluene)

Elemental analysis for $C_{50}H_{55}NO_8$:

|  | C | H | N |
|---|---|---|---|
| Calculated (%) | 75.28 | 6.90 | 1.76 |
| Found (%) | 75.32 | 6.72 | 1.80 |

To 100 parts of polyvinyl chloride, 1 part of the compound (38) was added. The resultant resin composition was injection molded so that a filter was fabricated. The filter was good in both durability and transmittance characteristics.

EXAMPLE 15

In a vessel equipped with a stirrer, reflux condenser and a nitrogen inlet tube, were charged 10 parts of the above-described compound (36), 17.2 parts of the below-described compound (39), 4.4 parts of potassium carbonate, 0.2 part of KI and 80 parts of N,N-dimethylformamide:

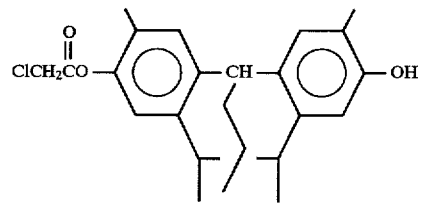

In a nitrogen atmosphere, the contents were reacted at 80° C. for 4 hours. After completion of the reaction, the reaction mixture was poured into 1000 parts of ice water and a precipitated solid was collected by filtration and then dried. By column chromatographic purification, 11 parts of the following compound (40) were obtained.

Visible light absorption, $\lambda_{max}$: 451 nm εg: $5.4 \times 10^4$ ml/g.cm (solvent: toluene)

Elemental analysis for $C_{48}H_{51}NO_8$:

|  | C | H | N |
|---|---|---|---|
| Calculated (%) | 74.90 | 6.63 | 1.82 |
| Found (%) | 75.03 | 6.62 | 1.85 |

One part of the quinophthalone compound (40) was dissolved in 25 parts of the below-described composition. Using a spinner, the resulting solution was spin-coated on a glass substrate. The resulting film was dried, pre-baked at 85°–100° C. for 2–5 minutes and through a mask having a stripe-shaped pattern, exposed to light from a high-pressure mercury lamp (20–30 mj/cm², 2 minutes). The film so exposed was then developed to form a pattern. Finally, the film so patterned was post-baked at 200°–230° C. for 10–30 minutes so that a stripe filter was obtained. The thickness of the dyestuff layer was 2 μm.

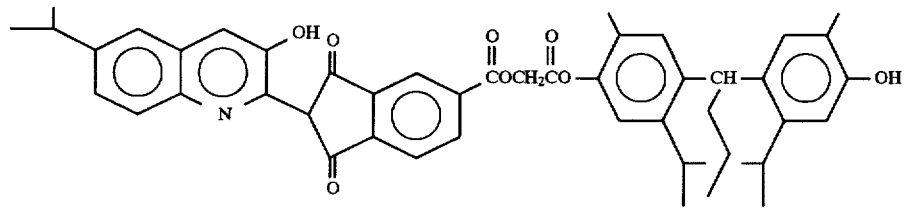

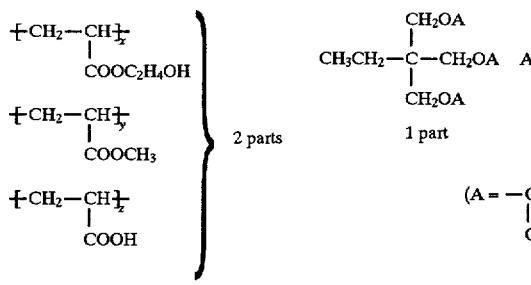
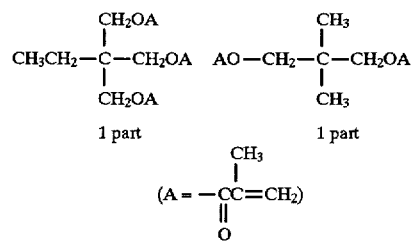
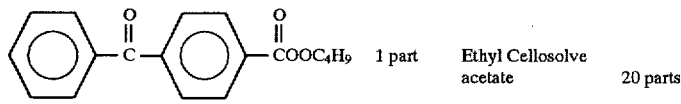

The filter had good durability and transmittance characteristics.

EXAMPLE 16

In a vessel equipped with a stirrer, reflux condenser and a nitrogen inlet tube, were charged 10 parts of the below-described compound (41), 18.9 parts of the below-described compound (42), 4.6 parts of potassium carbonate, 0.3 part of KI and 80 parts of N,N-dimethylformamide:

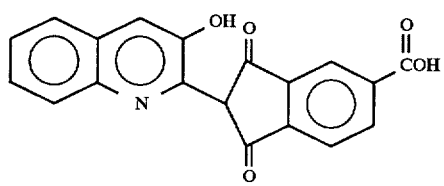

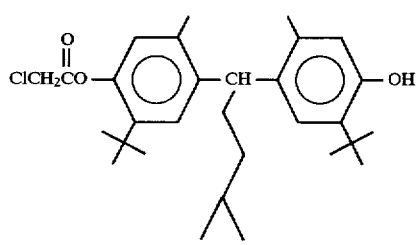

In a nitrogen atmosphere, the contents were reacted at 80° C. for 4 hours. After completion of the reaction, the reaction mixture was poured into 1000 parts of ice water and a precipitated solid was collected by filtration and then dried. By column chromatographic purification, 12.1 parts of the following compound (43) were obtained.

Visible light absorption, $\lambda_{max}$: 448 nm $\epsilon g$: $5.2 \times 10^4$ ml/g.cm (solvent: toluene)

Elemental analysis for $C_{49}H_{53}NO_8$:

|  | C | H | N |
|---|---|---|---|
| Calculated (%) | 75.10 | 6.77 | 1.79 |
| Found (%) | 75.15 | 6.72 | 1.82 |

To 100 parts of polymethyl methacrylate, 1 part of the compound (43) was added. The resultant resin composition was injection molded so that a filter was fabricated. The filter was good in both durability and transmittance characteristics.

EXAMPLE 17–86

In each Example, the dyestuff represented by formula (1) in which $R^1$ to $R^{10}$ are shown in Table 3 and the corresponding resin also shown in Table 3 were used to fabricate a filter. The filter had good durability and filter characteristics.

Incidentally, the resin abbreviations in Table 3 stand for the below-described resins. The reference of "Examples 6, 11 or 15" means use of the same resin composition as in Example 6, 11 or 15.

PS: Polystyrene
PMMA: Polymethyl methacrylate
PC: Polycarbonate
PET: Polyethylene terephthalate
PVC: Polyvinyl chloride
SD-17: Trade name, product of Dainippon Ink & Chemicals, Incorporated

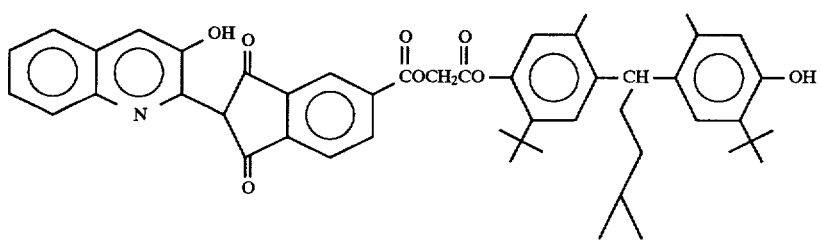

TABLE 3

| Example | Dye | X | n | $R^1$ | $R^2$ | $R^3$ | $R^4$ | $R^5$ | $R^6$ | $R^7$ | $R^8$ | $R^9$ | $R^{10}$ | Resin |
|---|---|---|---|---|---|---|---|---|---|---|---|---|---|---|
| 17 | 2-NH₂, 3-CH₃, 1-NHPh anthraquinone | — | 1 | CH₃ | H | H | i-C₃H₇ | H | CH₃ | i-C₃H₇ | H | H | C₄H₉ | SD-17 |
| 18 | 2-NH₂, 3-CH₃, 1-NHPh anthraquinone | — | 1 | H | H | H | H | H | H | H | H | H | i-C₃H₇ | SD-17 |
| 19 | 2-NH₂, 3-CH₃, 1-NHCH₃ anthraquinone | — | 1 | CH₃ | H | H | i-C₃H₇ | H | CH₃ | i-C₃H₇ | H | H | C₄H₉ | SD-17 |
| 20 | 1,4-diamino-2-CH₃ anthraquinone | — | 1 | CH₃ | H | H | i-C₃H₇ | H | CH₃ | i-C₃H₇ | H | H | C₄H₉ | SD-17 |

TABLE 3-continued

| Example | Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|---|
| 21 | (structure) | — | 1 | t-C₄H₉ | H | H | CH₃ | CH₃ | H | H | t-C₄H₉ | H | C₃H₇ | PMMA |
| 22 | (structure) | — | 1 | t-C₄H₉ | H | H | i-C₃H₇ | H | t-C₄H₉ | i-C₃H₇ | H | H | C₄H₉ | PMMA |
| 23 | (structure) | — | 1 | CH₃ | H | H | i-C₃H₇ | H | CH₃ | i-C₃H₇ | H | H | C₄H₉ | PET |
| 24 | (structure) | — | 1 | CH₃ | H | H | i-C₃H₇ | CH₃ | H | H | i-C₃H₇ | CH₃ | C₄H₉ | PMMA |

TABLE 3-continued

| Example Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|
| 25 | — | 1 | CH₃ | CH₃ | H | CH₃ | CH₃ | CH₃ | H | CH₃ | CH₃ | C₅H₁₁ | PC |
| 26 | — | 1 | i-C₃H₇ | H | H | H | i-C₃H₇ | H | H | H | i-C₃H₇ | H | PS |
| 27 | — | 1 | i-C₃H₇ | H | H | i-C₃H₇ | H | i-C₃H₇ | H | i-C₃H₇ | i-C₃H₇ | CH₃ | PET |
| 28 | — | 1 | i-C₃H₇ | H | H | i-C₃H₇ | i-C₃H₇ | i-C₃H₇ | H | i-C₃H₇ | i-C₃H₇ | C₃H₇ | PC |
| 29 | — | 1 | OCH₃ | H | OCH₃ | H | H | OCH₃ | H | OCH₃ | H | CH(CH₃)CH₂CH₃ | PVC |

Dye structures (Examples 25–29): anthraquinone-based dyes with NH₂ and NH-substituent groups:
- 25: 1-amino-4-(4-methoxyphenylamino)anthraquinone derivative
- 26: 1-amino-4-(naphthylamino)anthraquinone derivative
- 27: 1-amino-4-(naphthylamino)anthraquinone derivative
- 28: 1-amino-4-(NHC₂H₄Cl)anthraquinone derivative
- 29: 1-amino-4-(NHC₂H₄OH)anthraquinone derivative TABLE 3-continued

| Example | Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|---|
| 30 | (anthraquinone with NH₂, CH₃, NHC₂H₄OCH₃) | — | 1 | OCH₃ | H | OCH₃ | H | H | OCH₃ | H | OCH₃ | H | CH₂CH(CH₃)₂ | PET |
| 31 | (anthraquinone with NH₂, CH₃, NHC₂H₄N(CH₃)₂) | — | 1 | OCH₃ | H | H | H | H | OCH₃ | H | H | H | CH₂CH(CH₃)₂ | PC |
| 32 | (anthraquinone with NH₂, CH₃, NH-cyclohexyl) | — | 1 | Cl | H | Cl | Cl | Cl | H | H | Cl | CH₃ | C₂H₄CH(CH₃)₂ | Example 6 |
| 33 | (anthraquinone with NH₂, CH₃, NH-cyclopentyl) | — | 1 | Cl | H | Cl | H | H | Cl | H | Cl | CH₃ | C₂H₄CH(CH₃)₂ | Example 6 |

TABLE 3-continued

| Example | Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|---|
| 34 | (anthraquinone with NH₂, CH₃, and NH-cyclohexyl-OCH₃) | — | 1 | OC₂H₄Cl | H | H | H | H | OC₂H₄Cl | H | H | H | C₄H₉ | Example 6 |
| 35 | (anthraquinone with NH₂, CH₃, and NH-cyclohexyl-F) | — | 1 | H | H | H | t-C₄H₉ | H | H | t-C₄H₉ | H | H | C₄H₉ | Example 6 |
| 36 | (anthraquinone with NH₂, CH₃, and OH) | — | 1 | CH₃ | H | H | CH₃ | H | CH₃ | CH₃ | H | H | C₅H₁₁ | Example 11 |
| 37 | (anthraquinone with NH₂, CH₃, and OH) | — | 1 | C₂H₅ | H | C₂H₅ | H | H | C₂H₅ | H | C₂H₅ | H | i-C₃H₇ | Example 11 |
| 38 | (anthraquinone with NH₂, CH₃, and OH) | — | 1 | i-C₃H₇ | H | H | CH₃ | H | i-C₃H₇ | CH₃ | H | C₃H₇ | CH₃ | Example 15 |

TABLE 3-continued

| Example Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|
| 39 | — | 1 | OCH₃ | H | H | H | H | OCH₃ | H | H | C₃H₇ | H | Example 15 |
| 40 | — | 1 | OCH₃ | H | OCH₃ | H | H | OCH₃ | H | OCH₃ | C₄H₉ | H | Example 15 |
| 41 | — | 1 | OCH₃ | H | Br | H | H | OCH₃ | H | Br | C₄H₉ | H | PMMA |
| 42 | — | 1 | CH₃ | H | H | Br | H | CH₃ | Br | H | CH(CH₃)₂ | H | PVC |
| 43 | — | 1 | CH₃ | CH₃ | Br | H | H | Br | CH₃ | CH₃ | CH(CH₃)₂ | H | PVC |

TABLE 3-continued

| Example Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|
| 44 | — | 1 | i-C₃H₇ | H | i-C₃H₇ | H | H | i-C₃H₇ | H | i-C₃H₇ | CH₂CH(CH₃)₂ | H | PET |
| 45 | — | 1 | Br | H | Br | H | H | Br | H | Br | C₃H₇ | H | PS |
| 46 | — | 1 | i-C₃H₇ | H | H | CH₃ | H | i-C₃H₇ | CH₃ | H | C₄H₉ | CH₃ | PET |
| 47 | — | 1 | cyclo-C₅H₁₁ | H | H | H | H | cyclo-C₅H₁₁ | H | H | C₇H₁₅ | H | PMMA |
| 48 | — | 1 | CH₃ | H | H | i-C₃H₇ | H | CH₃ | i-C₃H₇ | H | H | C₄H₉ | PMMA |

TABLE 3-continued
| Example Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|
| 49 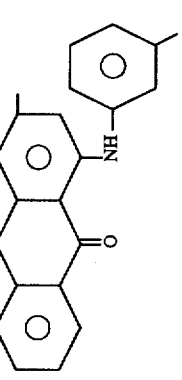 | — | 1 | H | H | H | H | H | H | H | H | H | i-$C_3H_7$ | PMMA |
| 50 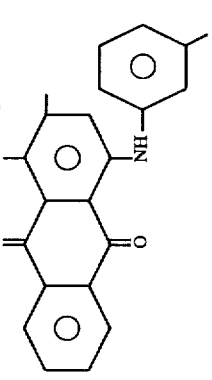 | — | 1 | $CH_3$ | H | H | i-$C_3H_7$ | H | $CH_3$ | i-$C_3H_7$ | H | H | $C_4H_9$ | PMMA |
| 51 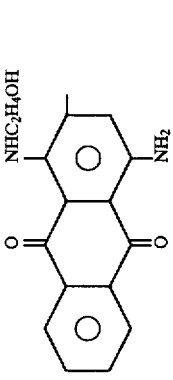 | — | 1 | t-$C_4H_9$ | H | H | i-$C_3H_7$ | H | t-$C_4H_9$ | i-$C_3H_7$ | H | H | $C_5H_{11}$ | PET |
| 52 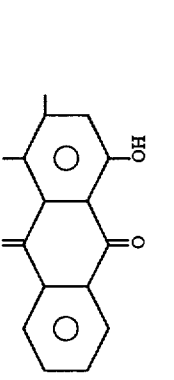 | — | 1 | $CH_3$ | H | H | i-$C_3H_7$ | H | $CH_3$ | i-$C_3H_7$ | H | $CH_3$ | $C_4H_9$ | Example 11 |

TABLE 3-continued

| Example Dye | Dye structure | X | n | $R^1$ | $R^2$ | $R^3$ | $R^4$ | $R^5$ | $R^6$ | $R^7$ | $R^8$ | $R^9$ | $R^{10}$ | Resin |
|---|---|---|---|---|---|---|---|---|---|---|---|---|---|---|
| 53 | (anthraquinone with N(CH₃)₂ and OH) | — | 1 | $CH_3$ | $CH_3$ | H | $CH_3$ | $CH_3$ | $CH_3$ | $CH_3$ | H | $CH_3$ | $C_5H_{11}$ | Example 11 |
| 54 | (naphthacenedione imide with N—CH₂—, NH₂, NH₂) | $\underset{\|}{\overset{O}{\underset{\|}{C}}}$ | 1 | i-$C_3H_7$ | H | H | H | H | i-$C_3H_7$ | H | H | i-$C_3H_7$ | H | Example 11 |
| 55 | (naphthacenedione imide with N—CH₂—, NH₂, OH) | $\underset{\|}{\overset{O}{\underset{\|}{C}}}$ | 1 | i-$C_3H_7$ | H | H | H | H | i-$C_3H_7$ | H | i-$C_3H_7$ | i-$C_3H_7$ | $CH_3$ | Example 11 |
| 56 | (naphthacenedione imide with N-tolyl, NH₂, NH₂) | $\underset{\|}{\overset{O}{\underset{\|}{C}}}$ | 1 | i-$C_3H_7$ | H | H | i-$C_3H_7$ | i-$C_3H_7$ | H | H | i-$C_3H_7$ | i-$C_3H_7$ | $C_3H_7$ | Example 6 |
| 57 | (naphthacenedione imide with N-tolyl, NH₂, OH) | $\underset{\|}{\overset{O}{\underset{\|}{C}}}$ | 1 | $OCH_3$ | H | $OCH_3$ | H | H | $OCH_3$ | H | $OCH_3$ | H | $CH_2CH(CH_3)_2$ | Example 6 |

TABLE 3-continued

| Example Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|
| 58 | −COCH₂C(=O)− | 1 | OCH₃ | H | OCH₃ | H | H | OCH₃ | H | OCH₃ | H | CH₂CH(CH₃)CH₃ | Example 6 |
| 59 | −C(=O)− | 1 | OCH₃ | H | H | H | H | OCH₃ | H | H | H | CH₂CH(CH₃)CH₃ | PMMA |
| 60 | −C(=O)− | 1 | Cl | H | Cl | Cl | Cl | H | H | Cl | CH₃ | C₂H₄CH(CH₃)CH₃ | PET |
| 61 | −COCH₂C(=O)− | 1 | Cl | H | Cl | H | H | Cl | H | Cl | CH₃ | C₂H₄CH(CH₃)CH₃ | PC |

TABLE 3-continued

| Example Dye | Structure | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|---|
| 62 | (indanone-quinoline structure) | $-COCH_2C-$ (with two =O) | 1 | $OC_2H_4Cl$ | H | H | H | H | $OC_2H_4Cl$ | H | H | H | $C_4H_9$ | PVC |
| 63 | (indanone-quinoline structure) | $-COCH_2C-$ (with two =O) | 1 | H | H | H | $t-C_4H_9$ | H | H | $t-C_4H_9$ | H | H | $C_4H_9$ | PVC |
| 64 | (indanone-quinoline structure) | $-COCH_2C-$ (with two =O) | 1 | $CH_3$ | H | H | $CH_3$ | $CH_3$ | H | H | $CH_3$ | H | $C_5H_{11}$ | PVC |
| 65 | (indanone-quinoline structure) | $-COCH_2CH_2C-$ (with two =O) | 1 | $C_2H_5$ | H | $C_2H_5$ | H | H | $C_2H_5$ | H | $C_2H_5$ | $C_2H_5$ | $i-C_3H_7$ | Example 15 |

TABLE 3-continued

| Example Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|
| 66 | —COCH₂C(=O)— | 1 | i-C₃H₇ | H | H | H | H | i-C₃H₇ | H | H | C₃H₇ | CH₃ | PET |
| 67 | —COCH₂CH₂C(=O)— | 1 | OCH₃ | H | OCH₃ | H | H | OCH₃ | H | H | C₃H₇ | H | PMMA |
| 68 | —COCH₂C(=O)— | 1 | OCH₃ | H | OCH₃ | H | H | OCH₃ | H | OCH₃ | C₄H₉ | H | Example 6 |
| 69 | —C(=O)— | 1 | OCH₃ | H | Br | H | H | OCH₃ | H | Br | C₄H₉ | H | Example 6 |

TABLE 3-continued

| Example | Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|---|
| 70 | (structure) | $-COCH_2C(=O)-$ | 1 | $CH_3$ | H | Br | H | H | $CH_3$ | H | Br | $i-C_3H_7$ | H | Example 6 |
| 71 | (structure) | — | 1 | $CH_3$ | $CH_3$ | Br | H | $CH_3$ | $CH_3$ | H | Br | $i-C_3H_7$ | H | Example 11 |
| 72 | (structure) | — | 1 | $i-C_3H_7$ | H | $i-C_3H_7$ | H | H | $i-C_3H_7$ | H | $i-C_3H_7$ | $CH_2CH(CH_3)CH_3$ | H | Example 11 |
| 73 | (structure) | — | 4 | $CH_3$ | H | H | $i-C_3H_7$ | H | $CH_3$ | $i-C_3H_7$ | H | H | $C_4H_9$ | PMMA |
| 74 | (structure) | — | 4 | H | H | H | H | H | H | H | H | H | $i-C_3H_7$ | PET |

TABLE 3-continued

| Example Dye | | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|
| 75 | Cu, X= — | 4 | CH₃ | H | H | i-C₃H₇ | H | CH₃ | i-C₃H₇ | H | H | C₄H₉ | PVC |
| 76 | Cu, X= — | 4 | CH₃ | H | H | i-C₃H₇ | H | CH₃ | i-C₃H₇ | H | H | C₄H₉ | PC |
| 77 | Cu, X= — | 4 | t-C₄H₉ | H | H | CH₃ | CH₃ | H | H | t-C₄H₉ | H | C₃H₇ | Example 11 |
| 78 | VO, X= — | 4 | t-C₄H₉ | H | H | i-C₃H₇ | H | t-C₄H₉ | i-C₃H₇ | H | H | C₄H₉ | Example 11 |

TABLE 3-continued

| Example | Dye | X | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|---|
| 79 | [structure] | — | 4 | CH₃ | H | H | i-C₃H₇ | H | CH₃ | i-C₃H₇ | H | H | C₄H₉ | Example 11 |
| 80 | [structure] | — | 4 | CH₃ | H | H | i-C₃H₇ | H | CH₃ | i-C₃H₇ | H | CH₃ | C₄H₉ | Example 11 |
| 81 | [structure] | — | 8 | CH₃ | CH₃ | H | CH₃ | CH₃ | CH₃ | CH₃ | H | CH₃ | i-C₃H₇ | Example 11 |
| 82 | [structure] | — | 8 | i-C₃H₇ | H | H | H | H | i-C₃H₇ | H | H | i-C₃H₇ | H | PMMA |

TABLE 3-continued

| Example | Dye | n | R¹ | R² | R³ | R⁴ | R⁵ | R⁶ | R⁷ | R⁸ | R⁹ | R¹⁰ | Resin |
|---|---|---|---|---|---|---|---|---|---|---|---|---|---|
| 83 | Pd-dye | 8 | i-C₃H₇ | H | i-C₃H₇ | H | H | i-C₃H₇ | H | i-C₃H₇ | i-C₃H₇ | CH₃ | PC |
| 84 | Cu-dye, X = −COCH₂C(=O)−O−C(=O)− | 4 | i-C₃H₇ | H | H | i-C₃H₇ | i-C₃H₇ | H | H | i-C₃H₇ | i-C₃H₇ | C₃H₇ | PVC |
| 85 | Pd-dye, X = −C(=O)− | 4 | OCH₃ | H | OCH₃ | H | H | OCH₃ | H | OCH₃ | H | CH(CH₃)CH₂CH₃ | PVC |
| 86 | Pd-dye | 10 | CH₃ | H | H | CH₃ | H | CH₃ | CH₃ | H | H | C₅H₁₁ | PMMA |

What is claimed is:

1. A color filter comprising an optically transparent substrate and a dyestuff represented by the following formula (5):

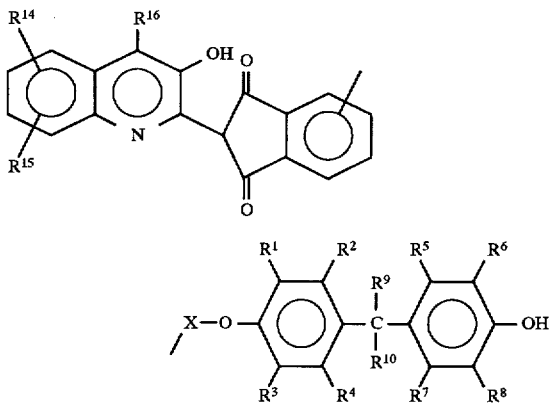

wherein $R^1$ to $R^8$ independently represent a hydrogen atom; a halogen atom; an unsubstituted alkyl group which is linear or branched and has 1 to 20 carbon atoms; an alkyl group which is linear or branched and is substituted by at least one of alkoxy, halogen, hydroxyl or amino substituents and has 1 to 30 carbon atoms in total; an unsubstituted cycloalkyl group which has 5 to 12 carbon atoms; a cycloalkyl group which is substituted by at least one of halogen, alkyl or alkoxy substituents and has 5 to 20 carbon atoms in total; an unsubstituted alkoxy group which is linear or branched and has 1 to 10 carbon atoms; or an alkoxy group which is linear or branched and is substituted by at least one of alkoxy or halogen substituents and has 1 to 20 carbon atoms in total; $R^9$ and $R^{10}$ independently represent a hydrogen atom; an unsubstituted alkyl group which is linear or branched and has 1 to 20 carbon atoms; or an alkyl group which is linear or branched and is substituted by at least one of alkoxy or halogen substituents and has 1 to 30 carbon atoms in total with the provision that one of $R^9$ and $R^{10}$ has 3 or more carbon atoms; $R^{14}$ and $R^{15}$ independently represent a hydrogen atom; an unsubstituted, linear or branched alkyl group having 1 to 20 carbon atoms; a linear or branched alkyl group substituted by at least one of halogen, alkoxy, hydroxyl or amino groups and having 1 to 30 carbon atoms in total; an unsubstituted, linear or branched alkoxy group having 1 to 20 carbon atoms; a linear or branched alkoxy group substituted by at least one of halogen, alkoxy, hydroxyl or amino groups and having 1 to 20 carbon atoms in total; or a halogen atom; and $R^{16}$ represents a hydrogen atom or a halogen atom; and X represents —CO—, —COOCH2CO— or —COOCH$_2$CH$_2$CO—.

2. A color filter comprising an optically transparent substrate and a dyestuff represented by the following formula (6):

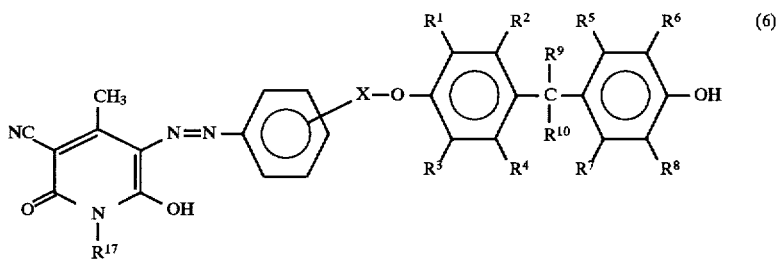

wherein $R^1$ to $R^8$ independently represent a hydrogen atom; a halogen atom; an unsubstituted alkyl group which is linear or branched and has 1 to 20 carbon atoms; an alkyl group which is linear or branched and is substituted by at least one of alkoxy, halogen, hydroxyl or amino substituents and has 1 to 30 carbon atoms in total; an unsubstituted cycloalkyl group which has 5 to 12 carbon atoms; a cycloalkyl group which is substituted by at least one of halogen, alkyl or alkoxy substituents and has 5 to 20 carbon atoms in total; an unsubstituted alkoxy group which is linear or branched and has 1 to 10 carbon atoms; or an alkoxy group which is linear or branched and is substituted by at least one of alkoxy or halogen substituents and has 1 to 20 carbon atoms in total; $R^9$ and $R^{10}$ independently represent a hydrogen atom; an unsubstituted alkyl group which is linear or branched and has 1 to 20 carbon atoms; or an alkyl group which is linear or branched and is substituted by at least one of alkoxy or halogen substituents and has 1 to 30 carbon atoms in total with the provision that one of $R^9$ and $R^{10}$ has 3 or more carbon atoms; $R^{17}$ represents an unsubstituted, linear or branched alkyl group having 1 to 20 carbon atoms; a linear or branched alkyl group substituted by at least one of halogen, alkoxy, hydroxyl or amino groups and having 1 to 30 carbon atoms in total; and X represents —CO— or —COOCH$_2$CO—.

* * * * *